(12) United States Patent
Liu et al.

(10) Patent No.: US 12,418,005 B2
(45) Date of Patent: Sep. 16, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tzuan-Horng Liu, Taoyuan (TW); Hao-Yi Tsai, Hsinchu (TW); Kris Lipu Chuang, Hsinchu (TW); Hsin-Yu Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 528 days.

(21) Appl. No.: 17/880,687

(22) Filed: Aug. 4, 2022

(65) Prior Publication Data

US 2024/0047436 A1    Feb. 8, 2024

(51) Int. Cl.
*H01L 25/10* (2006.01)
*H01L 25/00* (2006.01)
(Continued)

(52) U.S. Cl.
CPC ............ *H01L 25/105* (2013.01); *H01L 25/18* (2013.01); *H01L 25/50* (2013.01); *H01L 24/16* (2013.01);
(Continued)

(58) Field of Classification Search
CPC ....... H01L 25/105; H01L 25/18; H01L 25/50; H01L 24/16; H01L 24/20; H01L 24/32;
(Continued)

(56) References Cited

U.S. PATENT DOCUMENTS 9,000,584 B2    4/2015  Lin et al.
9,048,222 B2    6/2015  Hung et al.
(Continued)

FOREIGN PATENT DOCUMENTS

TW    201916280    4/2019
TW    202029425    8/2020
(Continued)

OTHER PUBLICATIONS

"Office Action of Taiwan Counterpart Application", issued on Nov. 13, 2023, p. 1-p. 10.

*Primary Examiner* — Fernando L Toledo
*Assistant Examiner* — Neil R Prasad
(74) *Attorney, Agent, or Firm* — JCIPRNET

(57) ABSTRACT

A semiconductor package and a manufacturing method are provided. The semiconductor package includes a first die disposed on and electrically coupled to a first redistribution structure and laterally covered by a first insulating encapsulation, a second die disposed over the first die and laterally covered by a second insulating encapsulation, a second redistribution structure interposed between and electrically coupled to the first and second dies, a third redistribution structure disposed on the second die and opposite to the second redistribution structure, and at least one thermal-dissipating feature embedded in a dielectric layer of the third redistribution structure and electrically isolated from a patterned conductive layer of the third redistribution structure through the dielectric layer. Through substrate vias of the first die are physically connected to the second redistribution structure or the first redistribution structure. The thermal-dissipating feature is thermally coupled to a back surface of the second die.

20 Claims, 27 Drawing Sheets

(51) Int. Cl.
*H01L 25/18* (2023.01)
*H01L 23/00* (2006.01)

(52) U.S. Cl.
CPC .............. *H01L 24/20* (2013.01); *H01L 24/32* (2013.01); *H01L 24/73* (2013.01); *H01L 2224/16227* (2013.01); *H01L 2224/214* (2013.01); *H01L 2224/32225* (2013.01); *H01L 2224/32245* (2013.01); *H01L 2224/73204* (2013.01); *H01L 2224/73259* (2013.01); *H01L 2224/73267* (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC ........... H01L 24/73; H01L 2224/16227; H01L 2224/214; H01L 2224/32225; H01L 2224/32245; H01L 2224/73204; H01L 2224/73259; H01L 2224/73267; H01L 2225/1035; H01L 2225/1041; H01L 2225/1058; H01L 2225/1094
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2010/0133704 A1* | 6/2010 | Marimuthu | H01L 23/3128 257/E23.116 |
| 2017/0098633 A1* | 4/2017 | Kumar | H01L 23/3114 |
| 2019/0148262 A1* | 5/2019 | Pei | H01L 25/105 257/713 |
| 2020/0006196 A1* | 1/2020 | Lin | H01L 23/5389 |
| 2020/0194331 A1* | 6/2020 | Kim | H01L 24/08 |
| 2021/0082783 A1* | 3/2021 | Kim | H01L 23/3677 |

FOREIGN PATENT DOCUMENTS

| | | |
|---|---|---|
| TW | 202109794 | 3/2021 |
| TW | I765778 | 5/2022 |

\* cited by examiner

SEMICONDUCTOR PACKAGE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced high heat density and poor thermal dissipation performance to the semiconductor package. Increased heat density in three-dimensional system can lead to electromigration and reliability issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
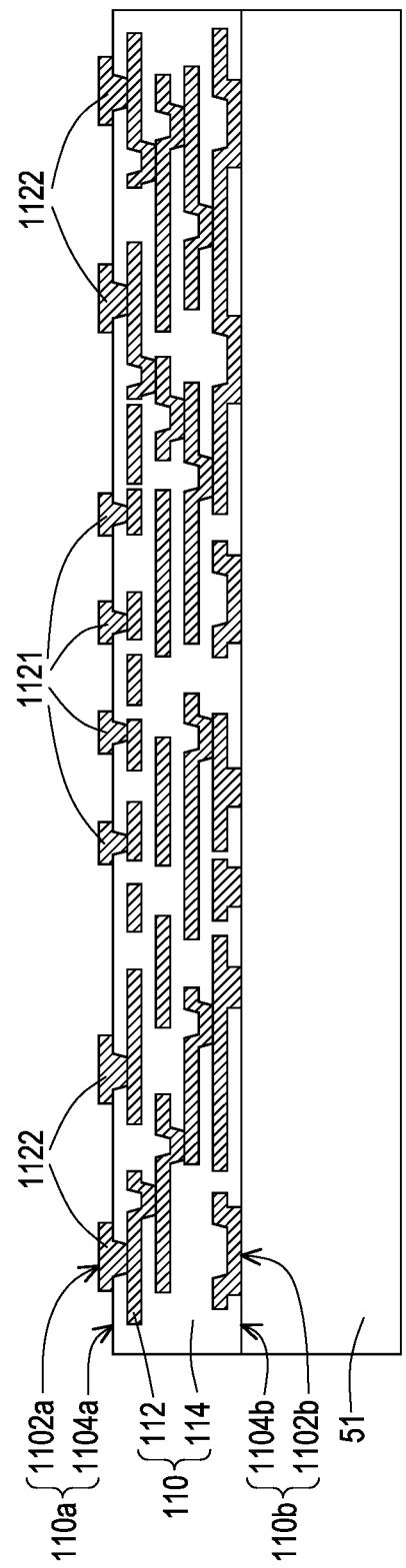
FIGS. 1A-1K are schematic cross-sectional views illustrating various stages of a manufacturing method of a semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
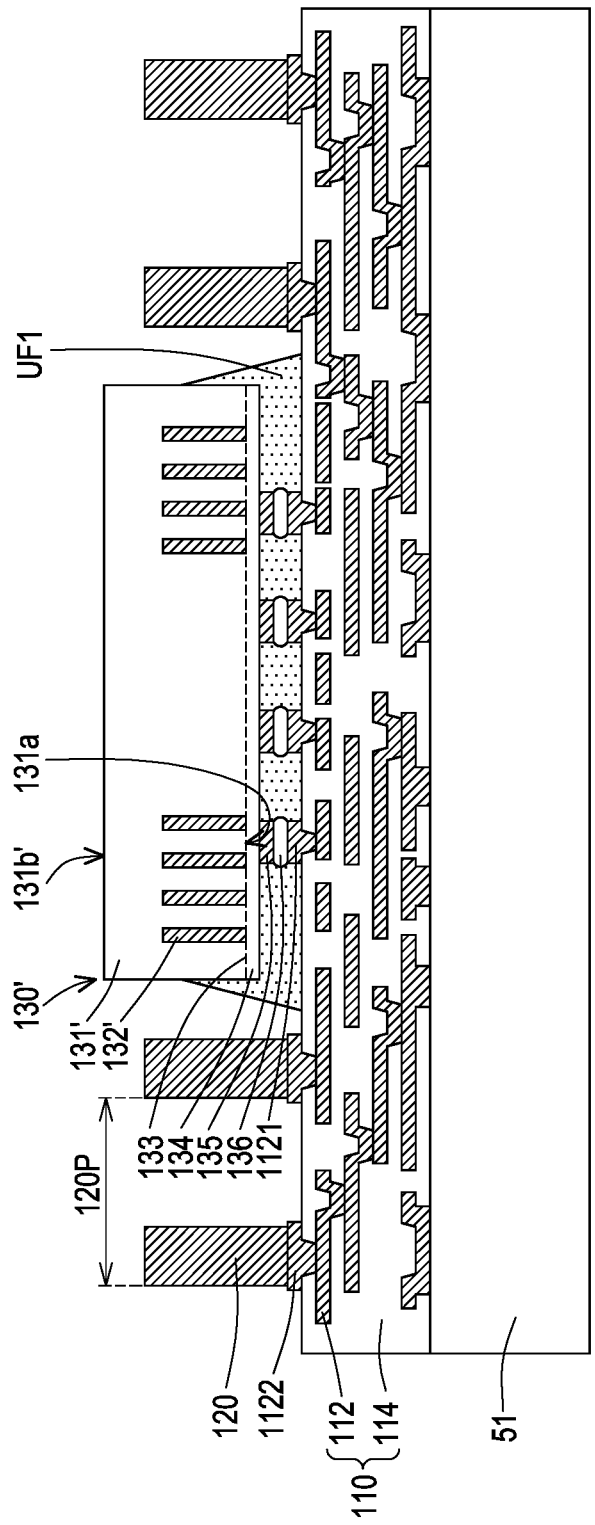
Figure 1C:
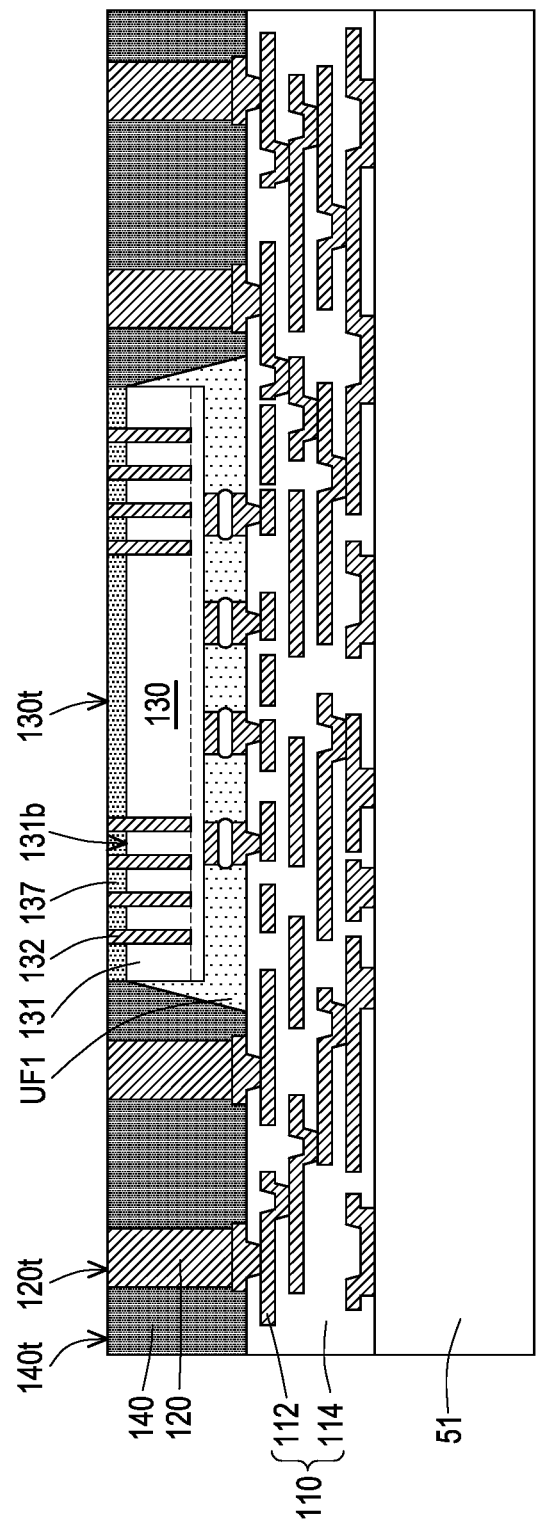
Figure 1D:
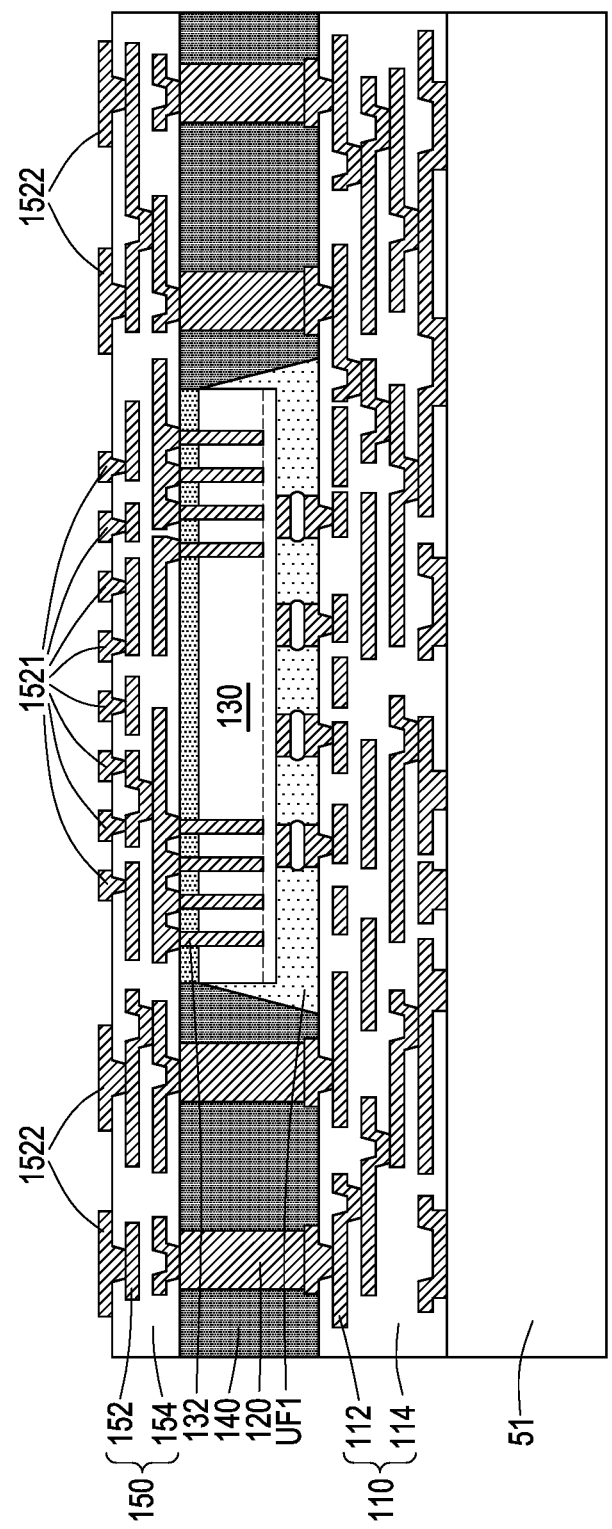
Figure 1E:
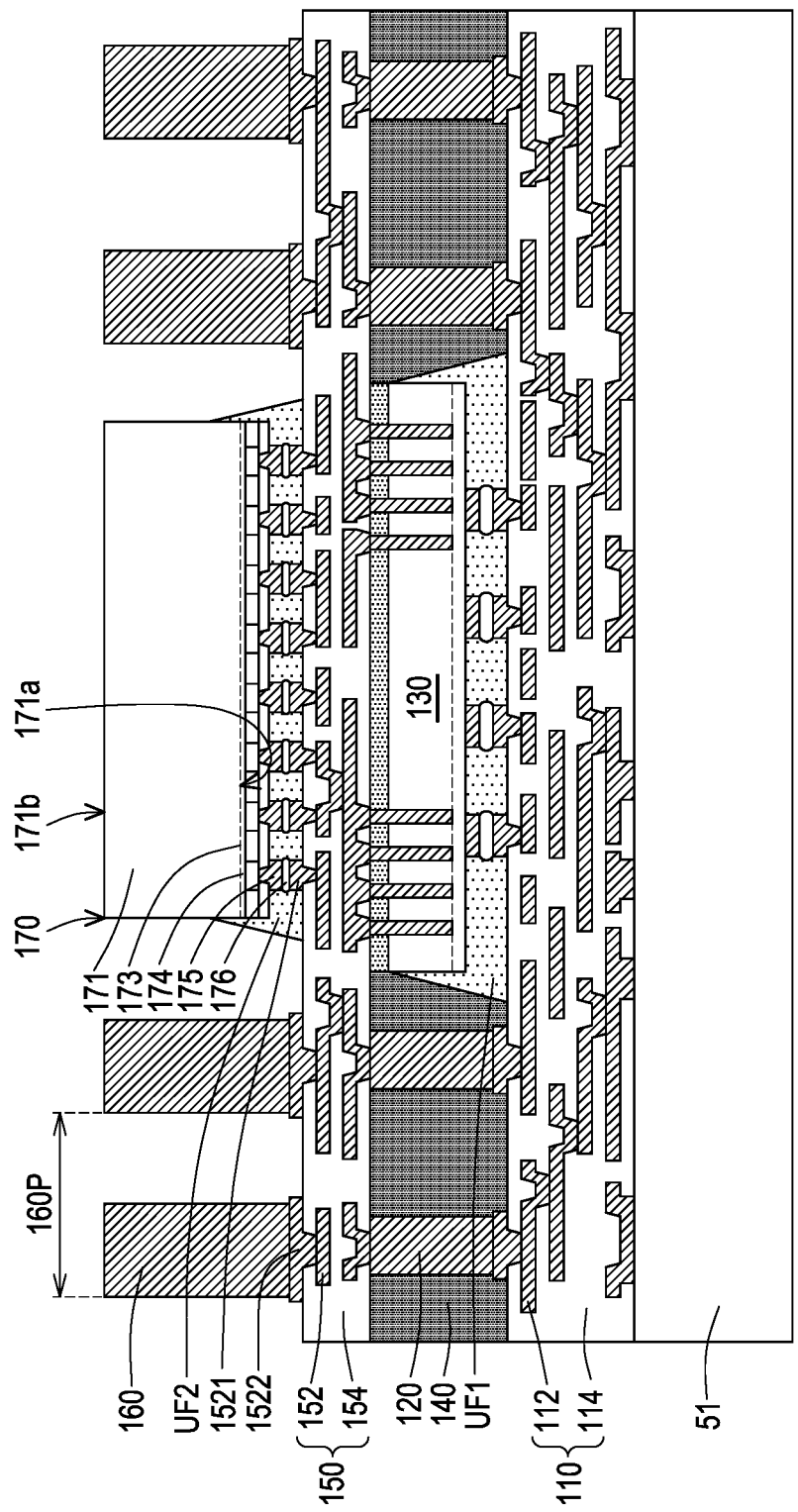
Figure 1F:
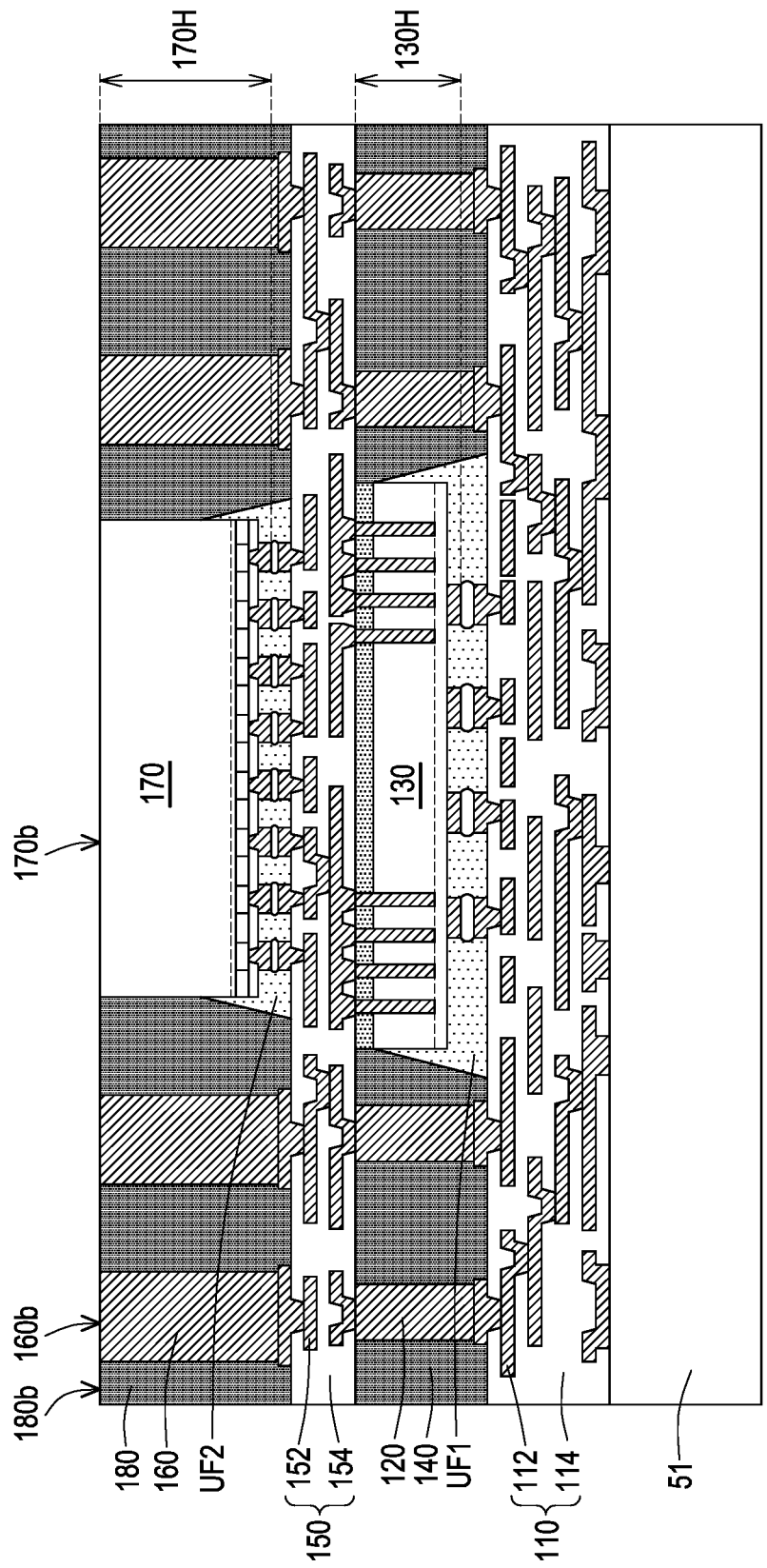
Figure 1G:
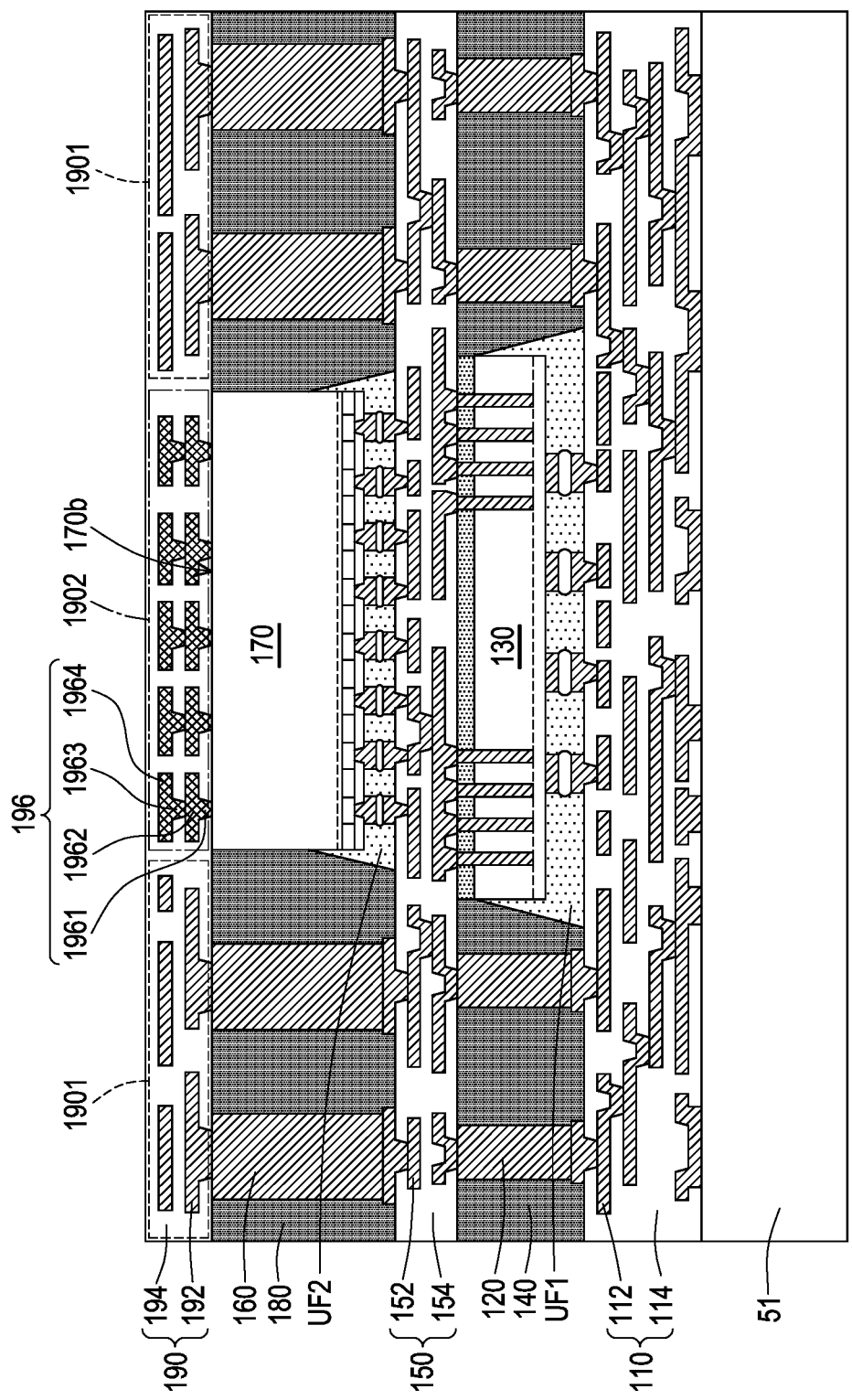
Figure 1H:
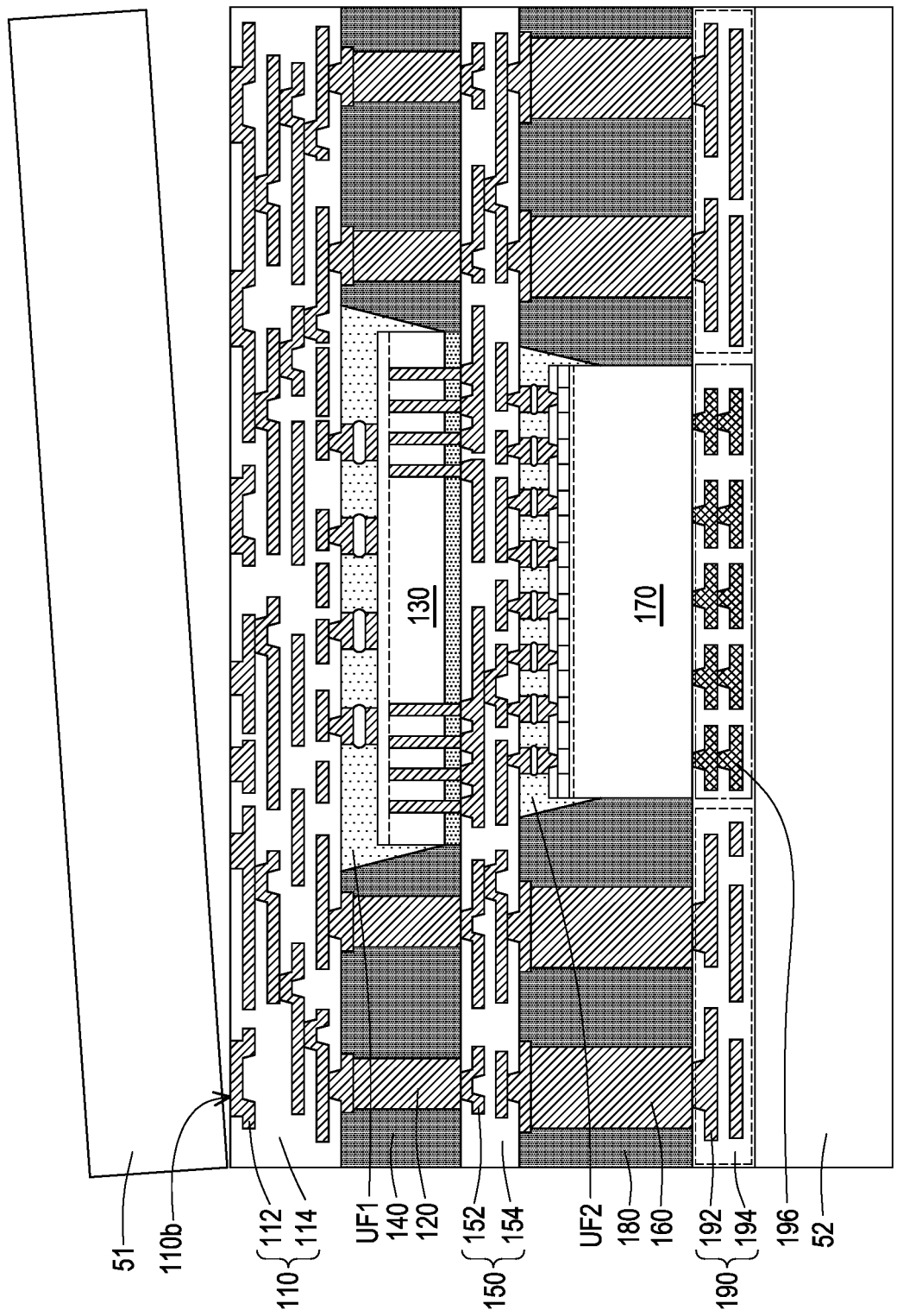
Figure 1I:
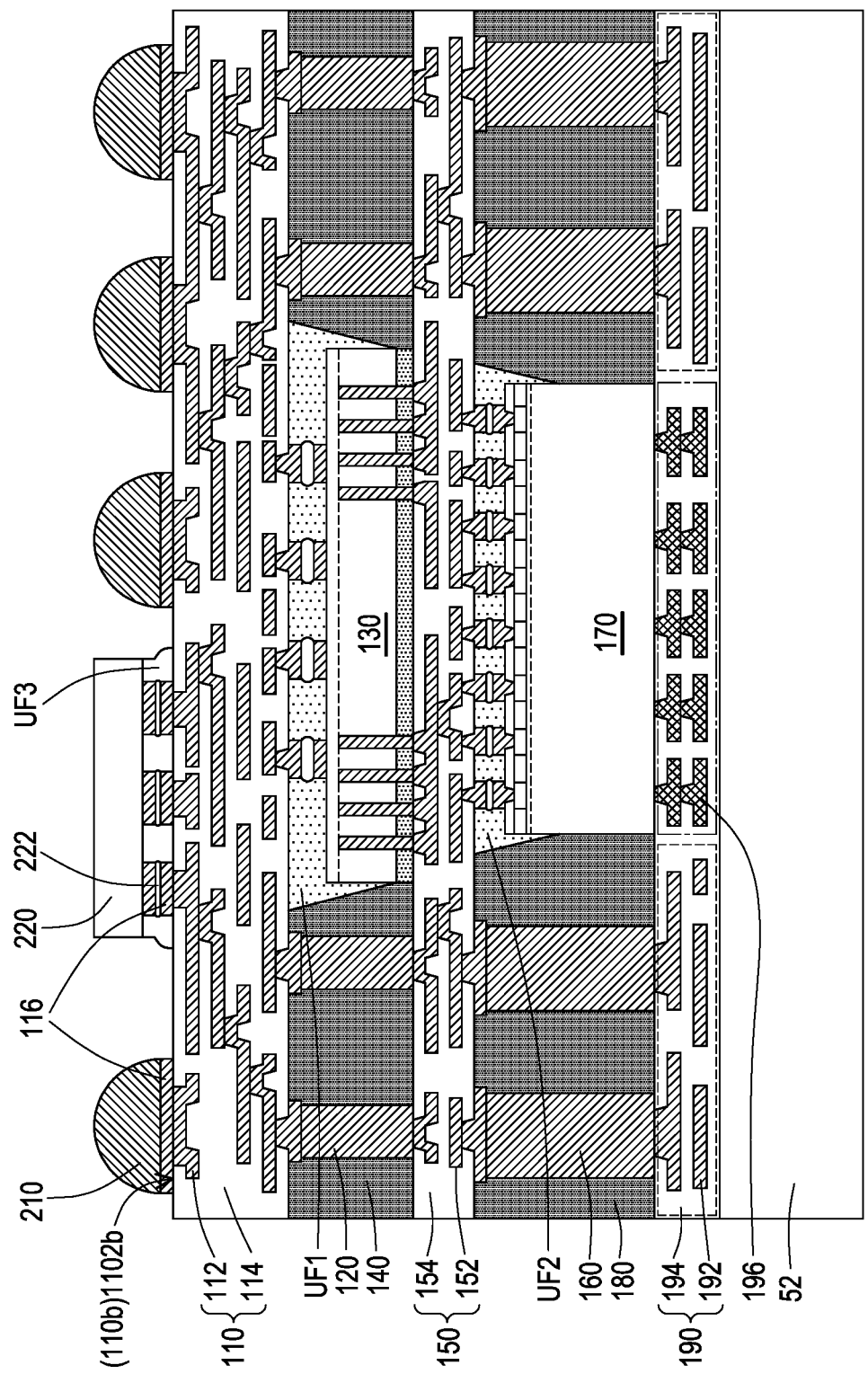
Figure 1J:
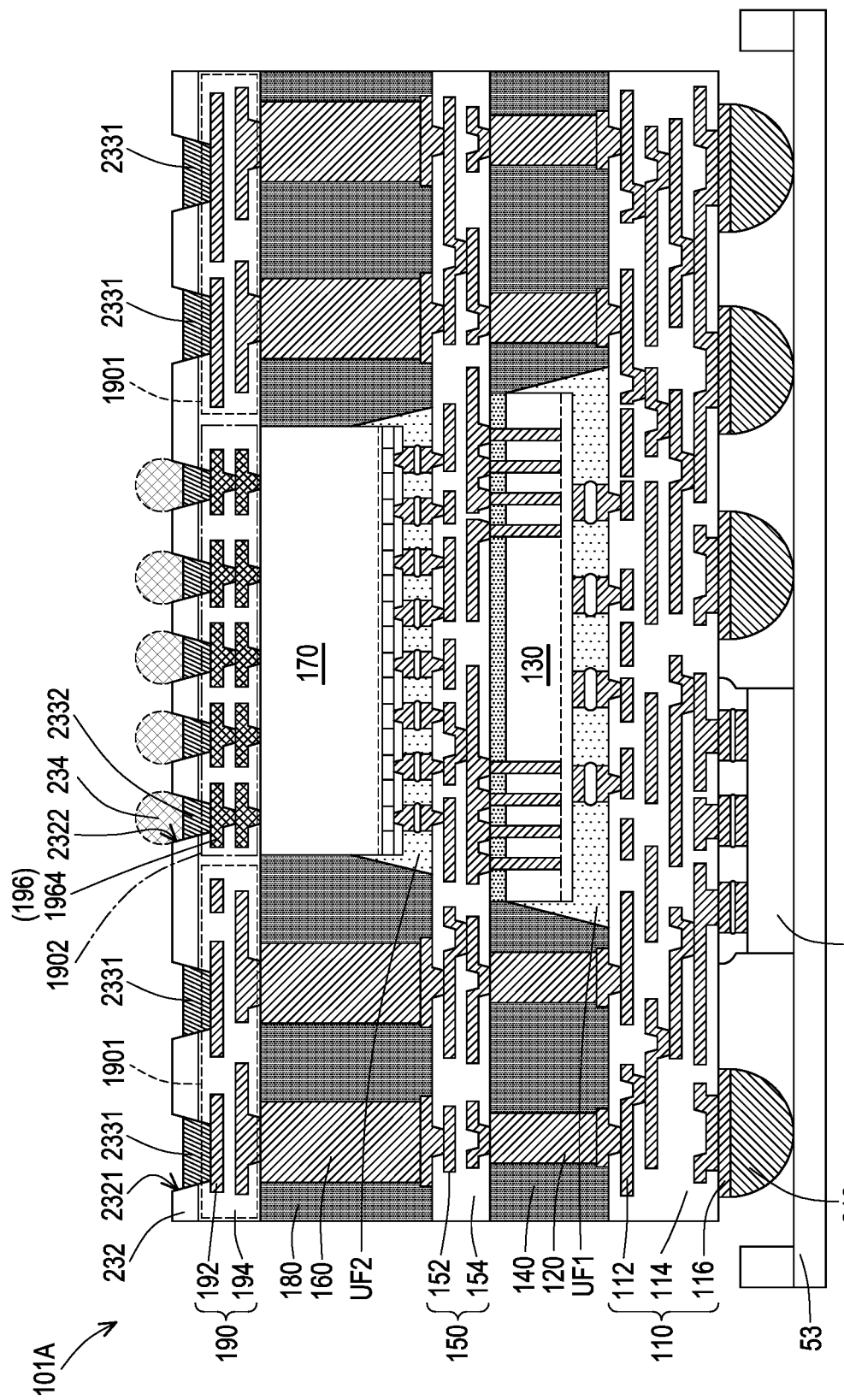
Figure 1K:
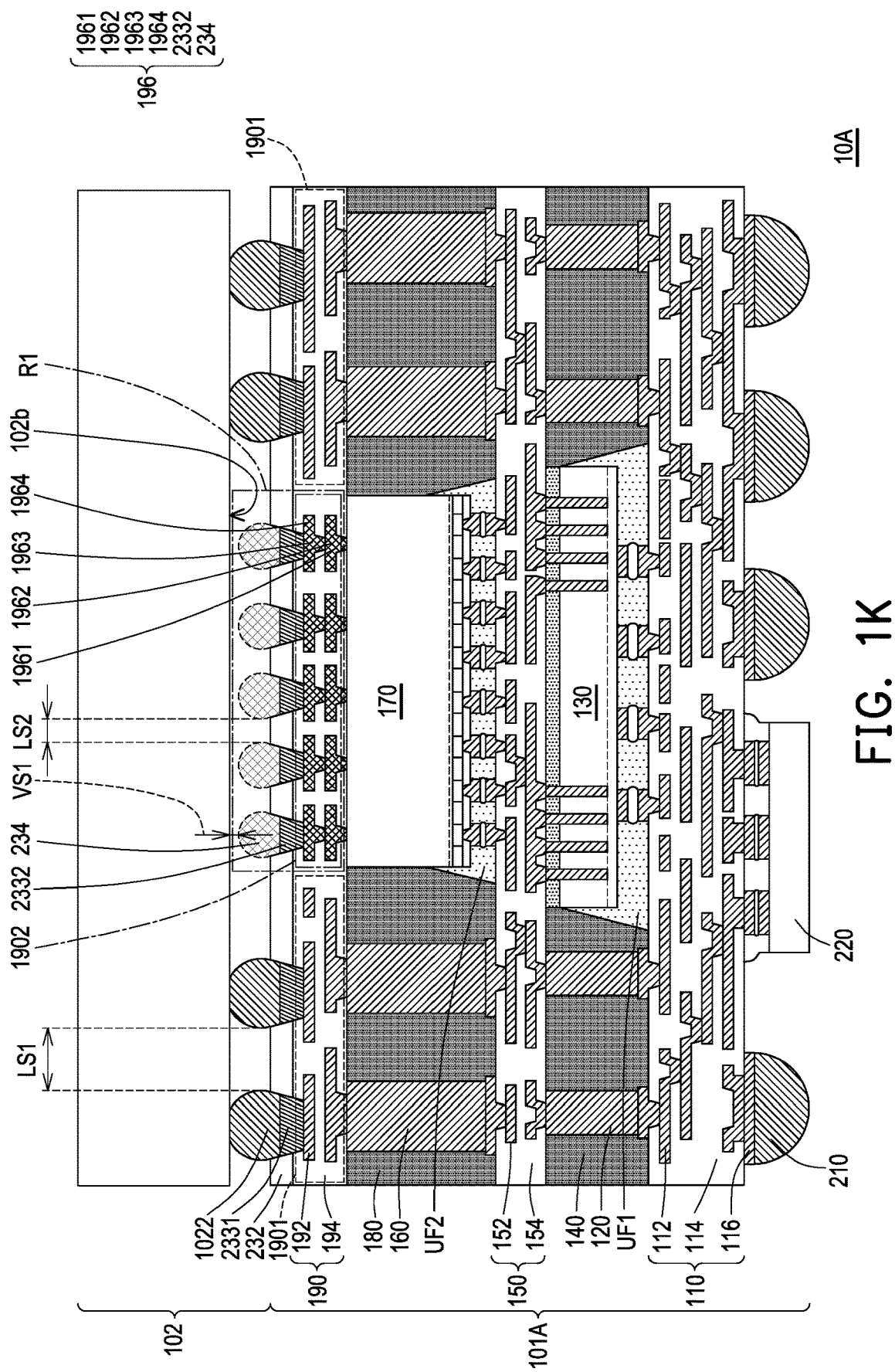
Figure 2A:
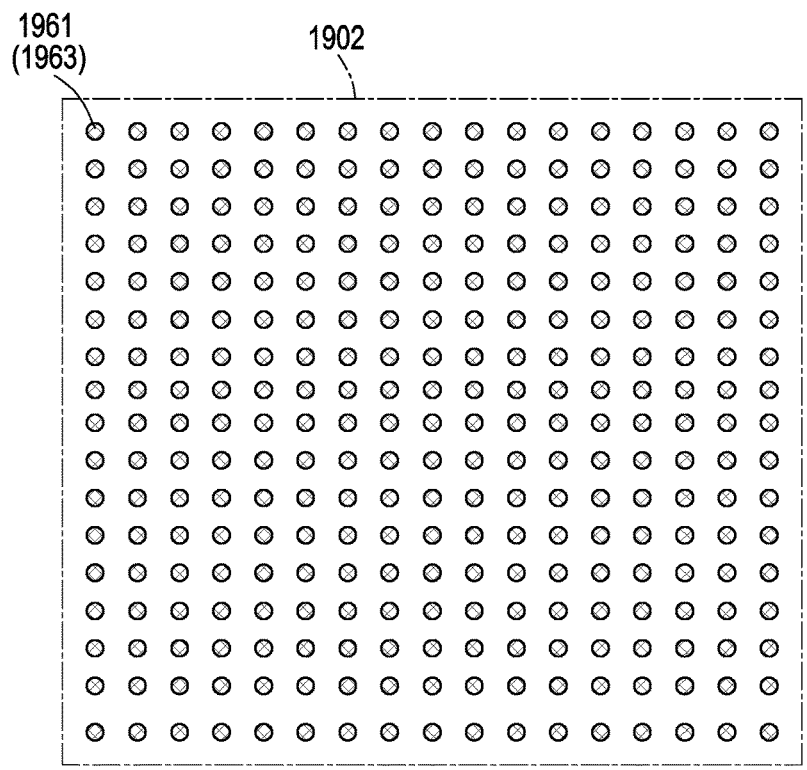
FIG. 2A is a schematic top view illustrating a configuration of thermal-dissipating vias, in accordance with some embodiments.
Figure 2B:
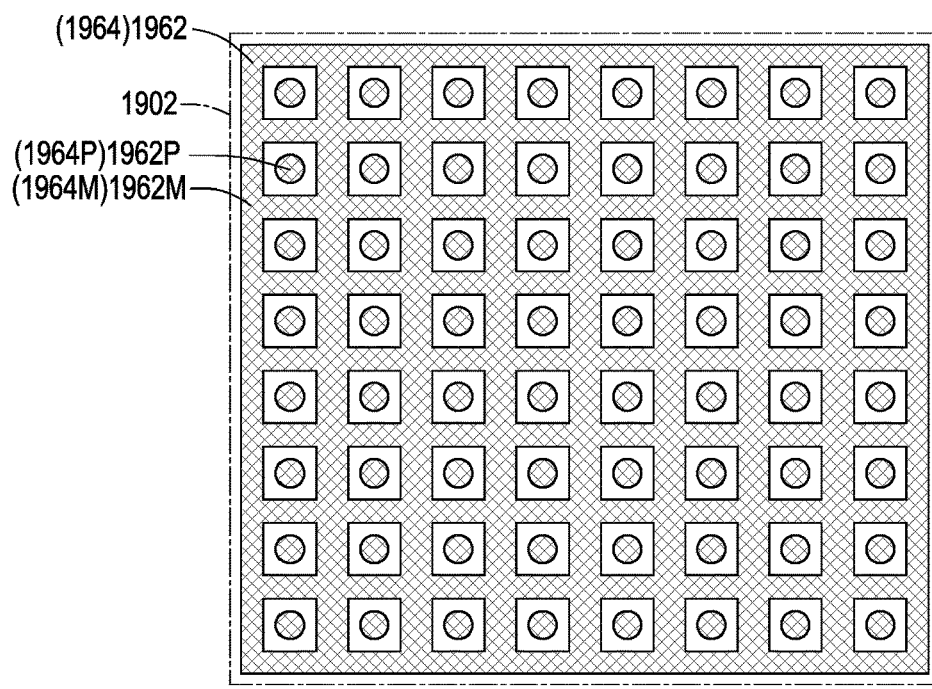
FIG. 2B is a schematic top view illustrating a configuration of a thermal-dissipating pattern, in accordance with some embodiments.
Figure 2C:
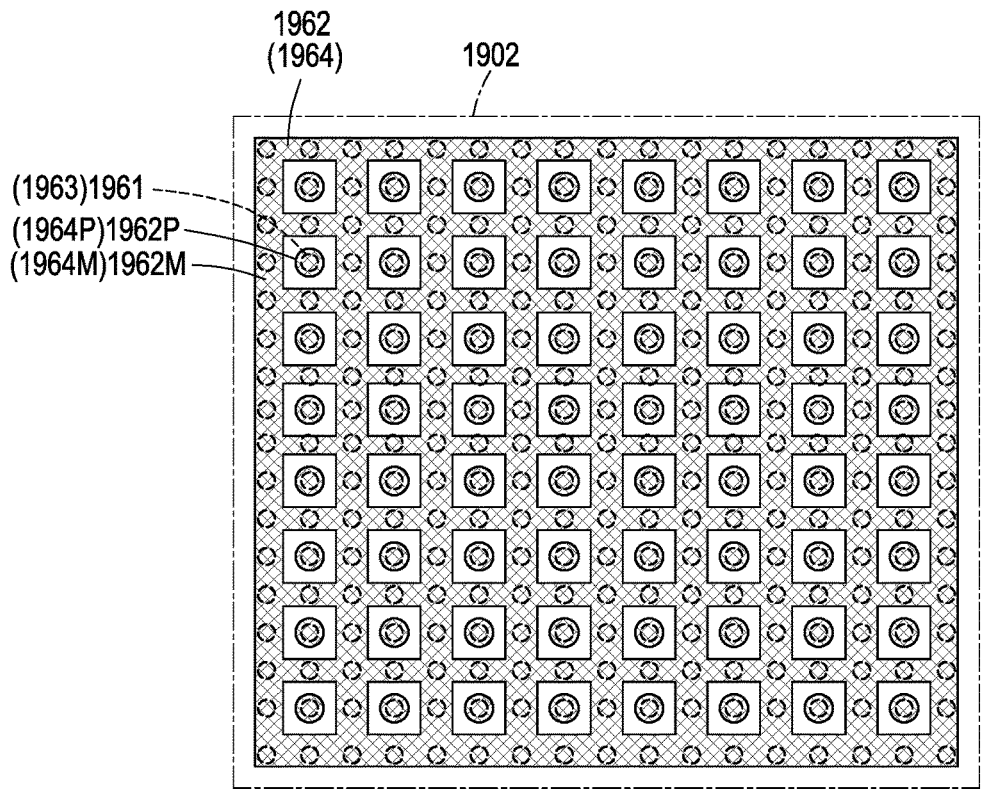
FIG. 2C is a schematic top view illustrating a combined configuration of the thermal-dissipating pattern and the thermal-dissipating vias, in accordance with some embodiments.
Figure 2D:
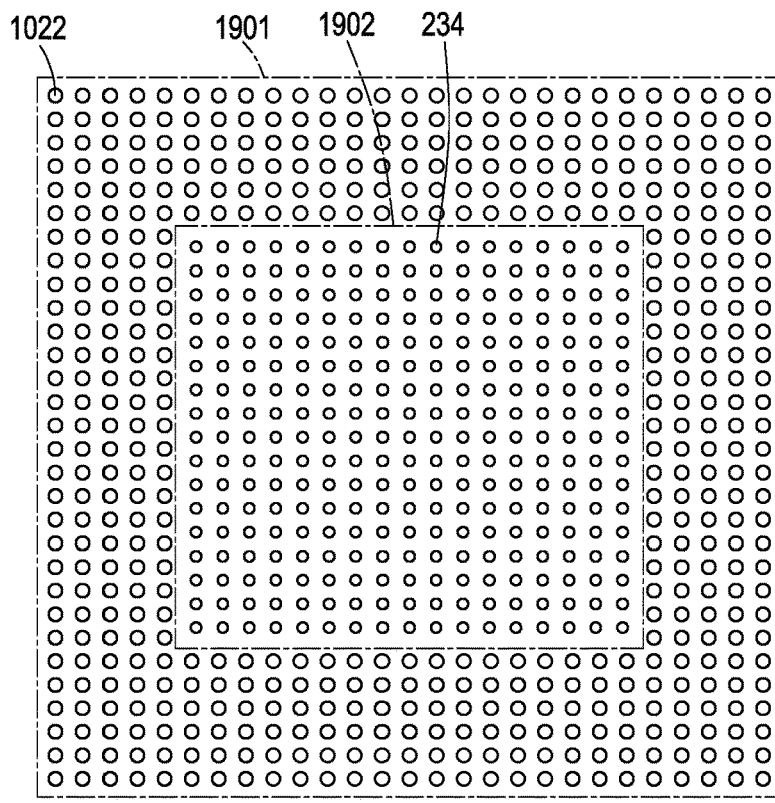
FIG. 2D is a schematic top view illustrating a configuration of conductive terminals and thermal-dissipating bumps, in accordance with some embodiments.

FIGS. 1A-1K are schematic cross-sectional views illustrating various stages of a manufacturing method of a semiconductor package, FIG. 2A is a schematic top view illustrating a configuration of thermal-dissipating vias, FIG. 2B is a schematic top view illustrating a configuration of a thermal-dissipating pattern, FIG. 2C is a schematic top view illustrating a combined configuration of the thermal-dissipating pattern and the thermal-dissipating vias, and FIG. 2D is a schematic top view illustrating a configuration of conductive terminals and thermal-dissipating bumps, in accordance with some embodiments.

Referring to FIG. 1A, a first redistribution structure 110 is formed over a first temporary carrier 51. The first temporary carrier 51 may be made of a material such as silicon, polymer, polymer composite, metal foil, ceramic, glass, glass epoxy, tape, or other suitable material for structural support. In some embodiments, an adhesive layer (not shown) is formed on the first temporary carrier 51 before the first redistribution structure 110 is formed. The adhesive layer may be detached from the first temporary carrier 51 by, e.g., shining an ultra-violet (UV) light on the first temporary carrier 51 in a subsequent carrier de-bonding process. For example, the adhesive layer is a light-to-heat-conversion (LTHC) coating layer or the like.

The first redistribution structure 110 may include one or more first patterned conductive layer(s) 112 formed in one or more first dielectric layer(s) 114. In some embodiments, the first dielectric layer 114 is formed of a polymer, such as polybenzoxazole (PBO), polyimide, benzocyclobutene (BCB), or the like; a nitride such as silicon nitride; an oxide such as silicon oxide, phosphosilicate glass (PSG), borosilicate glass (BSG), boron-doped phosphosilicate glass (BPSG), or the like. In some embodiments, the first patterned conductive layer 112 includes conductive lines, conductive vias, and conductive pads and may be formed of a suitable conductive material such as copper, titanium, tungsten, aluminum, alloys, or the like.

In some embodiments, the bottommost sublayer of the first dielectric layer 114 is formed and patterned over the first temporary carrier 51 by using lithography and etching or other suitable processes, and then the bottommost sublayer of the first patterned conductive layer 112 is formed on the top surface of the bottommost sublayer of the first dielectric layer 114 and in openings of the bottommost sublayer of the first dielectric layer 114. The steps of forming a sublayer of the first dielectric layer 114 and forming a sublayer of the first patterned conductive layer 112 may be repeated to form the first redistribution structure 110. It is noted that the number of sublayers of the first dielectric layer 114 and the first patterned conductive layer 112 in the first redistribution structure 110 may construe no limitation in the disclosure. Other methods of forming the first redistribution structure 110 are possible and fully intended to be included within the scope of the disclosure.

In some embodiments, the first redistribution structure 110 includes a first surface 110a and a second surface 110b opposite to the first surface 110a and facing the first temporary carrier 51. For example, surfaces 1104b and 1102b of the bottommost sublayers of the first dielectric layer 114 and the first patterned conductive layer 112 on the second surface 110b are substantially leveled (e.g., coplanar) with each other. In some embodiments, the first surface 110a includes a top surface of the topmost sublayer of the first dielectric layer 114 and a top surface of the topmost sublayer of the first patterned conductive layer 112, where the top surface of the topmost sublayer of the first patterned conductive layer 112 is protruded from the top surface of the topmost sublayer of the first dielectric layer 114. For example, the topmost sublayer of the first patterned conductive layer 112 includes first pads 1121 and second pads 1122 surrounding the first pads 1121. The pitch of the adjacent first pads 1121 may be less than that of the adjacent second pads 1122. The density per unit area of the first pads 1121 may be denser than that of the second pads 1122. The first and second pads 1121 and 1122 formed on the top surface of the topmost sublayer of the first dielectric layer 114 may be or include under bump metallization (UBM) structure for further electrical connection.

Referring to FIG. 1B, first conductive pillars 120 are formed on the second pads 1122 of the first patterned conductive layer 112 of the first redistribution structure 110. The first conductive pillars 120 may be formed by: forming a seed layer; forming a patterned photoresist over the seed layer, where each of the openings in the patterned photoresist corresponds to a location of the respective first conductive pillar 120 to be formed; filling the openings with an electrically conductive material such as copper using, e.g., plating or the like; removing the patterned photoresist using, e.g., an ashing or a stripping process; and removing portions of the seed layer on which the first conductive pillars 120 are not formed. Other methods for forming the first conductive pillars 120 are possible and fully intended to be included within the scope of the disclosure. By way of example and not limitation, a pitch 120P between two adjacent first conductive pillars 120 may be about 60 μm. Although other value(s) are also possible.

In some embodiments, a first die 130' is disposed over the first surface 110a of the first redistribution structure 110 and electrically coupled to the first patterned conductive layer 112. The first die 130' may be surrounded by the first conductive pillars 120. The first die 130' may be cut from a semiconductor wafer (not shown). The first die 130' may include a first semiconductor substrate 131' having a front surface 131a and a back surface 131b' opposite to the front surface 131a, conductive vias 132' embedded in the first semiconductor substrate 131' and extending from the front surface 131a toward the back surface 131b. The first semiconductor substrate 131' may include an elementary semiconductor (e.g., silicon or germanium in a crystalline, a polycrystalline, or an amorphous structure, etc.), a compound semiconductor (e.g., SiC, GaAs, GaP, InP, InAs, and/or InSb, etc.), an alloy semiconductor (e.g., SiGe, GaAsP, AlInAs, AlGaAs, GaInAs, GaInP, etc.), combinations thereof, or other suitable materials. In some embodiments, the first semiconductor substrate 131' may be a compound semiconductor substrate having a multilayer structure or any suitable substrate. The conductive vias 132' may include one or more conductive materials (e.g., cobalt, titanium, tungsten, copper, aluminum, tantalum, titanium nitride, tantalum nitride, gold, silver, another metal, a metal alloy, or combinations thereof).

The first die 130' may include a first device layer 133 having semiconductor devices (not shown) formed in/on the front surface 131a of the first semiconductor substrate 131' and electrically coupled to the conductive vias 132', a first interconnect structure 134 underlying the first device layer 133 and electrically coupled to the semiconductor devices of the first device layer 133, and first die connectors 135 underlying and electrically coupled to the first interconnect structure 134. The semiconductor devices in the first device layer 133 may be or include active devices (e.g., transistors, diodes, etc.) and/or passive devices (e.g., capacitors, resistors, inductors, etc.), or other suitable electrical devices. The first interconnect structure 134 may include one or more interconnect wiring layer(s) embedded in one or more interconnect dielectric layer(s), where the interconnect wiring layers are electrically coupled to the semiconductor devices in the first device layer 133 and the first die connectors 135. The first die connectors 135 may include a conductive material such as solder, copper, aluminum, gold, nickel, silver, palladium, tin, the like, or a combination thereof. In some embodiments, the first die connectors 135 include metal pillars (e.g., a copper pillar) formed by a sputtering, printing, plating, CVD, or the like, with or without a solder cap thereon. The metal pillars may be solder-free and have substantially vertical sidewalls or tapered sidewalls.

With continued reference to FIG. 1B, the first die connectors 135 of the first die 130' may be coupled to the first pads 1121 of the first redistribution structure 110 with a one-to-one correspondence. In some embodiments, first conductive joints 136, e.g., solder joints, are formed to connect the metal pillars of the first die connectors 135 and the first pads 1121. In some embodiments, a first underfill layer UF1 is formed in a gap between the first die 130' and the first redistribution structure 110 to surround the first conductive joints 136, the first die connectors 135, and the first pads 1121. In some embodiments, the first underfill layer UF1 extends upwardly to cover sidewalls of the first die 130'. The first underfill layer UF1 may be any acceptable material, such as a polymer, epoxy, molding underfill, or the like, and may be formed by dispensing or any other suitable method. In some embodiments, the first conductive pillars 120 are formed prior to the placement of the first die 130'. Alternatively, the first die 130' is coupled to the first redistribution structure 110 prior to the formation of the first conductive pillars 120.

Referring to FIG. 1C and with reference to FIG. 1B, a first insulating encapsulation 140 may be formed on the first redistribution structure 110 to cover the first conductive pillars 120, the first underfill layer UF1, and the first die 130. In some embodiments, the first insulating encapsulation 140 is a molding compound formed by a molding process. For example, the first insulating encapsulation 140 may include polymers (e.g., epoxy resins, phenolic resins, silicon-containing resins, or other suitable resins), dielectric materials, or other suitable materials. In some embodiments, the first insulating encapsulation 140 is made of a molding underfill material. In some embodiments, the first insulating encapsulation 140 includes inorganic fillers which can be added to optimize coefficient of thermal expansion (CTE) of the first insulating encapsulation 140. The disclosure is not limited thereto.

With continued reference to FIGS. 1C and 1B, in some embodiments, a layer of insulating encapsulation material is formed to encapsulate the first conductive pillars 120, the first underfill layer UF1, and the first die 130', and then a planarization process (e.g., chemical mechanical polishing (CMP), mechanical grinding, etching, a combination thereof, etc.) is performed on the insulating encapsulation material at least until the first conductive pillars 120 are accessibly exposed. In some embodiments, during the planarization process, the back surface 131b' of the first semiconductor substrate 131' of the first die 130' is thinned down. In some embodiments, a portion of the back side of the first semiconductor substrate 131' may be further removed such that the conductive vias 132' are protruded from the back surface 131b of the first semiconductor substrate 131 through etching or any suitable removal process. Subsequently, an isolation layer 137 may be formed on the back surface 131b of the first semiconductor substrate 131 to laterally cover the conductive vias 132. The isolation layer 137 may be made of low temperature polyimide or other suitable insulating material(s).

In some embodiments, the first conductive pillars 120 that penetrate through the first insulating encapsulation 140 may be referred to as first through insulation vias (TIVs) 120, and the conductive vias 132 that penetrate through the first semiconductor substrate 131 may be referred to as through substrate vias (TSVs) 132. In some embodiments, the top surface 130t of the first insulating encapsulation 140 is substantially leveled (or coplanar) with the top surfaces 120t of the first TIVs 120, within process variations. The top surface 140t of the first insulating encapsulation 140 may also be substantially leveled (or coplanar) with the back surface 130t of the first die 130, within process variations, where the back surface 130t of the first die 130 includes top surfaces of the TSVs 132 and the isolation layer 137.

Referring to FIG. 1D and with reference to FIG. 1C, a second redistribution structure 150 may be formed on the first TIVs 120, the first die 130, and the first insulating encapsulation 140. The second redistribution structure 150 may include one or more second patterned conductive layer(s) 152 formed in one or more second dielectric layer(s) 154. In some embodiments, the second dielectric layer 154 may include a polymer, such as PBO, polyimide, BCB, or the like; a nitride such as silicon nitride; an oxide such as silicon oxide, PSG, BSG, BPSG, or the like. The second dielectric layer 154 may be formed by a suitable deposition process, such as spin-coating, CVD, the like, or a combination thereof. In some embodiments, the second patterned conductive layer 152 includes conductive lines, conductive vias, and conductive pads and may be formed of a suitable conductive material such as copper, titanium, tungsten, aluminum, or the like.

In some embodiments, the bottommost sublayer of the second dielectric layer 154 overlies the top surfaces of the first TIVs 120, the first die 130, and the first insulating encapsulation 140, and the bottommost sublayer of the second patterned conductive layer 152 is in physical and electrical contact with the top surfaces of the first TIVs 120 and the TSVs 132 of the first die 130. The second redistribution structure 150 may be electrically coupled to the first redistribution structure 110 through the first die 130 and/or the first TIVs 120. In some embodiments, the topmost sublayer of the second patterned conductive layer 152 has first pads 1521 and second pads 1522 formed on the topmost sublayer of the second dielectric layer 154, where the first pads 1521 are located right above the first die 130, and the second pads 1522 surround the first pads 1521. The pitch of the adjacent first pads 1521 may be less than that of the adjacent second pads 1522. The density per unit area of the first pads 1521 may be denser than that of the second pads 1522. The first and second pads 1521 and 1522 may be UBM structure for further electrical connection.

Referring to FIG. 1E, second conductive pillars 160 are formed on the second pads 1522 of the second patterned conductive layer 152 of the second redistribution structure 150. The second conductive pillars 160 may be formed by a method the same as (or similar to) the formation of the first conductive pillars 120 described in FIG. 1B. In some embodiments, a pitch 160P between two adjacent second conductive pillars 160 is greater than the pitch 120P between two adjacent first conductive pillars 120 (labeled in FIG. 1B). By way of example and not limitation, the pitch 160P may be about 200 µm. Although other value(s) are fully intended to be included within the scope of the disclosure.

In some embodiments, a second die 170 is disposed over the second redistribution structure 150 and electrically coupled to the second patterned conductive layer 152. The second die 170 may be surrounded by the second conductive pillars 160. The second die 170 may be cut from a semiconductor wafer (not shown). The second die 170 may include a second semiconductor substrate 171 having a front surface 171a and a back surface 171b opposite to the front surface 171a. The material of the second semiconductor substrate 171 may be the same as or similar to that of the first semiconductor substrate 131 of the first die 130. The second die 170 may include a second device layer 173 having semiconductor devices (not shown) and formed in/on the front surface 171a of the second semiconductor substrate 171, a second interconnect structure 174 underlying the second device layer 173 and electrically coupled to the semiconductor devices of the second device layer 173, and second die connectors 175 underlying and electrically coupled to the second interconnect structure 174.

The semiconductor devices in the second device layer 173 may be or include active devices (e.g., transistors, diodes, etc.) and/or passive devices (e.g., capacitors, resistors, inductors, etc.), or other suitable electrical devices. The second interconnect structure 174 may include one or more interconnect wiring layer(s) embedded in one or more interconnect dielectric layer(s), where the interconnect wiring layers are electrically coupled to the semiconductor devices in the second device layer 173 and the second die connectors 175. The second die connectors 175 may include a conductive material such as solder, copper, aluminum, gold, nickel, silver, palladium, tin, the like, or a combination thereof. In some embodiments, the second die connectors 175 include metal pillars (e.g., a copper pillar) formed by a sputtering, printing, plating, CVD, or the like, with or without a solder cap thereon. The metal pillars may be solder-free and have substantially vertical sidewalls or tapered sidewalls.

With continued reference to FIG. 1E, the second die connectors 175 of the second die 170 may be coupled to the first pads 1521 of the second redistribution structure 150 with a one-to-one correspondence. In some embodiments, second conductive joints 176, e.g., solder joints, are formed to connect the metal pillars of the second die connectors 175 and the first pads 1521. In some embodiments, a second underfill layer UF2 is formed in a gap between the second die 170 and the second redistribution structure 150 to surround the second conductive joints 176, the second die connectors 175, and the first pads 1521. In some embodiments, the second underfill layer UF2 extends upwardly to cover sidewalls of the second die 170. The second underfill layer UF2 may be the same as or similar to the first underfill layer UF1 described in FIG. 1B. In some embodiments, the second conductive pillars 160 are formed prior to the placement of the second die 160. Alternatively, the second die 160 is coupled to the second redistribution structure 150 prior to the formation of the second conductive pillars 160.

Referring to FIG. 1F, a second insulating encapsulation 180 may be formed on the second redistribution structure 150 to cover the second conductive pillars 160, the second underfill layer UF2, and the second die 170. The second insulating encapsulation 180 may be the same as or similar to the first insulating encapsulation 140 described in FIG. 1C. In some embodiments, a layer of insulating encapsulation material is formed to encapsulate the second conductive pillars 160, the second underfill layer UF2, and the second die 170, and then a planarization process (e.g., CMP, mechanical grinding, etching, a combination thereof, etc.) is performed on the insulating encapsulation material at least until the second conductive pillars 160 are accessibly exposed. During the planarization process, a portion of the back side of the second semiconductor substrate 171 of the second die 170 may be removed, such that the back surface 170b of the second die 170 may be accessibly revealed by the second insulating encapsulation 180. In some embodiments, the second conductive pillars 160 that penetrate through the second insulating encapsulation 160 may be referred to as second TIVs 160. In some embodiments, the top surface 180t of the second insulating encapsulation 180 is substantially leveled (or coplanar) with the top surfaces 160t of the second TIVs 160 and the back surface 170b of the second die 170, within process variations.

In some embodiments, the first die 130 and the second die 170 are of different types of dies. The thickness 170H of the second die 170 may be greater than the thickness 130 of the first die 130. The first die 130 and/or the second die 170 may be or include a logic die (e.g., a central processing unit (CPU), a graphics processing unit (GPU), a system-on-a-chip (SoC), an application processor (AP), and a microcontroller); a power management die; a wireless and radio frequency (RF) die; a baseband (BB) die; a sensor die; a micro-electro-mechanical-system (MEMS) die; a signal processing die; a front-end die (e.g., an analog front-end (AFE) die); an application-specific integrated circuit (ASIC) die; a combination thereof; or the like. In alternative embodiments, the first die 130 and/or the second die 170 may be or include a memory die (e.g., a dynamic random-access memory (DRAM) die, a static random-access memory (SRAM) die, a resistive random-access memory (RRAM), a magneto-resistive random-access memory (MRAM), a NAND flash memory, a hybrid memory cube (HMC) module, a high bandwidth memory (HBM) module); a combination thereof; or the like. In alternative embodiments, the first die 130 and/or the second die 170 may be or include an artificial intelligence (AI) engine; a computing system (e.g., an AI server, a high-performance computing (HPC) system, a high-power computing device, a cloud computing system, a networking system, an edge computing system, a SoIC system, etc.); a combination thereof; or the like.

Referring to FIG. 1G, a third redistribution structure 190 may be formed on the second TIVs 160, the second die 170, and the second insulating encapsulation 180. The third redistribution structure 190 may include one or more third patterned conductive layer(s) 192 formed in one or more third dielectric layer(s) 194. In some embodiments, the third dielectric layer 194 includes a polymer, such as PBO, polyimide, BCB, or the like; a nitride such as silicon nitride; an oxide such as silicon oxide, PSG, BSG, BPSG, or the like. The third dielectric layer 194 may be formed by a suitable deposition process, such as spin-coating, CVD, the like, or a combination thereof. In some embodiments, the third patterned conductive layer 192 includes conductive lines, conductive vias, and conductive pads, and may be formed of a suitable conductive material such as copper, titanium, tungsten, aluminum, or the like.

In some embodiments, the third patterned conductive layer 192 are formed within a circuit region 1901 of the third redistribution structure 190 directly above the second TIVs 160. A region directly above the second die 170 may be a thermal-dissipating region 1902 which is free of the third patterned conductive layer 192. For example, the thermal-dissipating region 1902 is surrounded by the circuit region 1901 and electrically isolated from the circuit region 1901 through the third dielectric layer 194. The term "isolated" as used herein refers to a structure or layer that is not integrated with (e.g., part of) another structure, such as the patterned conductive layer, and it is disposed in a non-functional area in the third redistribution structure. In some embodiments, thermal-dissipating features 196 are formed within the thermal-dissipating region 1902 and may be electrically floating in the third redistribution structure 190. The thermal-dissipating features 196 may include first thermal-dissipating vias 1961 directly landing on the back surface 170b of the second die 170, a first thermal-dissipating pattern 1962 overlying the first thermal-dissipating vias 1961, second thermal-dissipating vias 1963 landing on the first thermal-dissipating pattern 1962, and a second thermal-dissipating pattern 1964 overlying the second thermal-dissipating vias 1963.

With continued reference to FIG. 1G, the first thermal-dissipating vias 1961, the first thermal-dissipating pattern 1962, the second thermal-dissipating vias 1963, and the second thermal-dissipating pattern 1964 may include conductive material(s) such as copper, titanium, tungsten, aluminum, or the like. The first and second thermal-dissipating vias 1961 and 1963 may be formed during the same step of forming the conductive vias of the third patterned conductive layer 192, and the first and second thermal-dissipating patterns 1962 and 1964 may be formed during the same step of forming the conductive pads and conductive lines of the third patterned conductive layer 192. Although four levels of the thermal-dissipating patterns and thermal-dissipating vias are illustrated in FIG. 1G, it should be noted that more (or less) levels of the thermal-dissipating patterns and thermal-dissipating vias may be formed in other embodiments.

Still referring to FIG. 1G and also referring to FIGS. 2A-2B, the first thermal-dissipating vias 1961 (and/or the thermal-dissipating vias 1963) may be arranged in an array within the thermal-dissipating region 1902. In some embodiments, the first thermal-dissipating vias 1961 (and/or the second thermal-dissipating vias 1963) are distributed evenly (e.g., having a same pitch) within the thermal-dissipating region 1902. The first thermal-dissipating vias 1961 (and/or the thermal-dissipating vias 1963) may each have a circular top-view shape. Although other suitable top-view shape (e.g., oval, rectangular, square, polygonal, etc.) may be possible. The arrangement, size, shape, and number of the thermal-dissipating vias may vary depending on the thermal-dissipating requirements of the product. In some embodiments, the first thermal-dissipating pattern 1962 may include a mesh 1962M and pads 1962P formed within openings of the mesh 1962M from the top view, where the pads 1962P and the openings of the mesh 1962M are formed with a one-to-one correspondence. In some embodiments, the boundary of the mesh 1962M may follow the boundary of the second die 170 (or the boundary of the thermal-dissipating region 1902) from the top view, and the locations of the pads 1962P may correspond to the locations of the underlying first thermal-dissipating vias 1961. The second thermal-dissipating pattern 1964 may include a mesh 1964M and pads 1964P that are arranged in a same (or similar) manner as the configuration of the first thermal-dissipating pattern 1962.

Still referring to FIG. 1G and also referring to FIG. 2C, as seen from the top view, the first thermal-dissipating pattern 1962 overlies the first thermal-dissipating vias 1961, and the second thermal-dissipating pattern 1964 overlies the second thermal-dissipating vias 1963. Taking the first thermal-dissipating pattern 1962 and the first thermal-dissipating vias 1961 for example, the width of each column (and/or each row) of the mesh 1962M may be greater than the diameter of the corresponding group of the first thermal-dissipating vias 1961. For example, a first group of columns and rows of the first thermal-dissipating vias 1961 are arranged within the columns and rows the mesh 1962M, respectively. A second group of columns and rows of the first thermal-dissipating vias 1961 may be arranged within the pads 1962P. In some embodiments, the mesh 1962M and the pads 1962P fully (or partially) cover the first thermal-dissipating vias 1961 from the top view. The second thermal-dissipating pattern 1964 and the second thermal-dissipating vias 1963 may have the same (or similar) configuration as the first thermal-dissipating pattern 1962 and the first thermal-dissipating vias 1961.

Referring to FIG. 1H and with reference to FIG. 1G, the structure of FIG. 1G may be flipped upside-down and disposed on a second temporary carrier 52. The second temporary carrier 52 may be made of a material such as silicon, polymer, polymer composite, metal foil, ceramic, glass, glass epoxy, tape, or other suitable material for structural support. In some embodiments, an adhesive layer (not shown) is formed on the second temporary carrier 52, and the third redistribution structure 190 may be attached to the adhesive layer. The adhesive layer may be detached from the second temporary carrier 52 by, e.g., shining UV light in a subsequent carrier de-bonding process. For example, the adhesive layer is a LTHC coating layer or the like.

The first temporary carrier 51 may then be removed by a suitable process, such as etching, grinding, mechanical peeling-off, etc., to accessibly reveal the second surface 110b of the first redistribution structure 110. In an embodiment where an adhesive layer (e.g., a LTHC film) is formed between the first temporary carrier 51 and the first redistribution structure 110, the first temporary carrier 51 is de-bonded by exposing to a laser or UV light. The laser or UV light breaks the chemical bonds of the adhesive layer that binds to the first temporary carrier 51, and the first temporary carrier 51 may then be de-bonded. Residues of the adhesive layer, if any, may be removed by a cleaning process performed after the carrier de-bonding process. In some embodiments, during the cleaning process, the seed layer (e.g., Ti layer) of the first patterned conductive layer 112 on the second surface 110b may also be removed.

Referring to FIG. 1I, UBM pads 116 may be formed on the second surface 110b of the first redistribution structure 110 and may be in physical and electrical contact with the outermost surface 1102b of the first patterned conductive layer 112. In some embodiments, the UBM pads 116 in different regions may have different dimensions. For example, a portion of the UBM pads 116 for connecting the subsequently-formed conductive terminals may have a critical dimension greater than a critical dimension of another portion of the UBM pads 116 for connecting the subsequently-mounted electrical device. By way of example and not limitation, a critical dimension of a portion of the UBM pads 116 for connecting the subsequently-formed conductive terminals is about 200 µm, while a critical dimension of a portion of the UBM pads 116 for connecting the subsequently-mounted electrical device is about 55 µm. By way of example and not limitation, a pitch between two adjacent two UBM pads 116 for connecting the subsequently-formed conductive terminals is about 350 µm, while a pitch between two adjacent two UBM pads 116 for connecting the subsequently-mounted electrical device is about 96 µm. Although other values may be possible.

In some embodiments, conductive terminals 210 are formed on some of the UBM pads 116. The conductive terminals 210 may include a conductive material such as solder, copper, aluminum, gold, nickel, silver, palladium, tin, the like, or a combination thereof. The conductive terminals 210 may be solder balls, metal pillars, a ball grid array (BGA), controlled collapse chip connection (C4) bumps, micro bumps, electroless nickel-electroless palladium-immersion gold (ENEPIG) technique formed bumps, combination thereof (e.g., a metal pillar having a solder ball attached thereof), or the like. In some embodiments, the conductive terminals 210 include an eutectic material and may include a solder bump, a solder ball, or the like. A reflow process may be performed, giving the conductive terminals 210 a shape of a partial sphere. Alternatively, the conductive terminals 210 may include non-spherical conductive connectors or other shapes.

With continued reference to FIG. 1I, an electrical device 220, such as an integrated passive device (IPD), is optionally disposed on and electrically coupled to the first redistribution structure 110 through a portion of the UBM pads 116. Conductive joints 222, such as solder joints, may be formed between the electrical device 220 and the underlying UBM pads 116. The conductive joints 222 may include a same material (e.g., solder) as the conductive terminals 210. The electrical device 220 may be electrically coupled to the first die 130 through the first patterned conductive layer 112 of the first redistribution structure 110. In some embodiments, a third underfill layer UF3 may be formed in a gap between the electrical device 220 and the second surface 110*b* of the first redistribution structure 110 to surround the conductive joints 222 for protection.

Referring to FIG. 1J and with reference to FIG. 1I, the structure of FIG. 1I may be flipped upside-down to be disposed on a frame 53, and then the second temporary carrier 52 may be removed to accessibly reveal the third redistribution structure 190. The removal of the second temporary carrier 52 may be similar to the removal of the first temporary carrier 51 described previously, and thus the detailed descriptions are not repeated. In some embodiments, a patterned dielectric layer 232 is formed on the topmost sublayer of the third dielectric layer 194 and extends across the circuit region 1901 and the thermal-dissipating region 1902. The patterned dielectric layer 232 may have a different material than the underlying third dielectric layer 194. The patterned dielectric layer 232 may be or include organic dielectric material, such as an Ajinomoto Buildup Film (ABF), a solder resist film, or the like. In some embodiments, the patterned dielectric layer 232 is referred to as a patterned resist layer.

In some embodiments, a layer of the dielectric material is formed on the third dielectric layer 194, and then one or more patterning process (e.g., laser drilling, lithography and etching, combinations thereof, or the like) may be performed to form the patterned dielectric layer 232. In some embodiments, during the patterning process, the underlying third dielectric layer 194 may be partially removed to accessibly reveal the third patterned conductive layer 192 and the second thermal-dissipating pattern 1964. For example, after the patterning process, first openings 2321 are formed to accessibly reveal the topmost sublayer of the third patterned conductive layer 192 corresponding to the circuit region 1901, and second openings 2322 are formed to accessibly reveal the second thermal-dissipating pattern 1964 corresponding to the thermal-dissipating region 1902. In some embodiments, the pitch of two adjacent first openings 2321 may be greater than the pitch of two adjacent second openings 2322. The opening width of the first openings 2321 may be greater than the opening width of the second openings 2322. By way of example and not limitation, the opening width of the first openings 2321 is about 240 μm, while the opening width of the second openings 2322 is about 200 μm. In alternative embodiments, the opening width of the first openings 2321 may be substantially equal to the opening width of the second openings 2322. Although other values of the opening widths are fully intended to be included within the scope of the disclosure.

With continued reference to FIG. 1J, first pre-solder layers 2331 may be formed on the topmost sublayer of the third patterned conductive layer 192 in the first openings 2321, and second pre-solder layers 2332 may be formed on the second thermal-dissipating pattern 1964 in the second openings 2322. The first and second pre-solder layers 2331 and 2332 may include materials, e.g., electroless nickel with immersion gold, electroless nickel-phosphorous with immersion gold, electroless nickel with electroless palladium and immersion gold, or the like, and may be formed by printing, dispensing, or the like. In some embodiments, thermal-dissipating bumps 234 may be attached onto the second pre-solder layers 2332 within the second openings 2322. The thermal-dissipating bumps 234 and the underlying thermal-dissipating vias and patterns are of the same material. The thermal-dissipating bumps 234 may be or may include copper balls, copper studs, copper pillars and other thermal conductive material(s).

The thermal-dissipating features 196 may further include the thermal-dissipating bumps 234 and the underlying second pre-solder layers 2332. In some embodiments, the structure formed on the frame 53 shown in FIG. 1J is collectively viewed as a lower package component 101A. In alternative embodiments, the second pre-solder layers 2332 within the second openings 2322 are omitted, and the thermal-dissipating bumps 234 are directly formed on the second thermal-dissipating pattern 1964 within the second openings 2322. In alternative embodiments, the thermal-dissipating bumps 234 are omitted. In such case, the lower package component have the second pre-solder layers 2332 formed in the second openings 2322, and heat generated from the second die 170 may dissipate toward an ambient environment through the second pre-solder layers 2332.

Referring to FIG. 1K and with reference to FIG. 1J, an upper package component 102 may be disposed on and electrically coupled to the lower package component 101A to form a semiconductor package 10A. The upper package component 102 may be or may include a memory package or other types of package component which is not limited thereto. In some embodiments, external terminals of the upper package component 102 are disposed on the first pre-solder layers 2331 within the first openings 2321, and then a reflow process is performed to form conductive joints 1022 electrically and mechanically coupling the upper package component 102 to the lower package component 101A. In some embodiments, the external terminals of the upper package component 102 and the first pre-solder layers 2331 include a solder material, and the conductive joints 1022 connecting therebetween are solder joints. In some embodiments, no visible interface is formed between the first pre-solder layers 2331 and the conductive joints 1022.

With continued reference to FIG. 1K and also referring to FIG. 2D, the thermal-dissipating bumps 234 in the thermal-dissipating region 1902 may be fully shielded by the upper package component 102, the conductive joints 1022 formed within the circuit region 1901 may surround the thermal-dissipating bumps 234. The lateral spacing LS1 between two adjacent conductive joints 1022 may be greater than the lateral spacing LS2 between two adjacent thermal-dissipating bumps 234. The diameter of the conductive joints 1022 may be greater than that of the thermal-dissipating bumps 234. By way of example and not limitation, the diameter of the conductive joints 1022 is about 350 μm, while the diameter of the thermal-dissipating bumps 234 is about 250 μm. Although other values are fully intended to be included within the scope of the disclosure.

In alternative embodiments, the thermal-dissipating bumps 234 are replaced with one or more thermal-dissipating block (or strip) that may be at least disposed right over hot spot(s) of the second die 170. It should be noted that the configuration and the number of the conductive joints 1022 and the thermal-dissipating bumps 234 illustrated in FIG. 2D are merely examples and construe no limitation in the disclosure. In some embodiments, the thermal-dissipating bumps 234 are not in physical contact with the upper package component 102. For example, a vertical spacing VS1 is formed between the top of each thermal-dissipating bumps 234 and the bottommost surface 102*b* of the upper package component 102, where the vertical spacing VS1 is non-zero.

After coupling the upper package component 102 to the lower package component 101A, an underfill layer (not shown) is optionally formed between the upper package component 102 and the lower package component 101A to surround the conductive joints 1022 and separate the thermal-dissipating bumps 234 from the upper package component 102. In some embodiments, the lower package component 101A is formed at wafer level, and a singulation process may be performed to form individual lower package components 101A, and then the frame 53 may be removed from the lower package components 101A. After the singulation process, the lower package component 110A may have a coterminous sidewall including sidewalls of the patterned dielectric layer 232, the third dielectric layer 194, the second insulating encapsulation 180, the second dielectric layer 154, the first insulating encapsulation 140, and the first dielectric layer 114.

The semiconductor package 10A includes the first die 130 and the second die 170 stacked over the first die 130, where the active side of the second die 170 faces the back side of the first die 130, and thus the configuration of the semiconductor package 10A may be referred to as face-to-back configuration. In some embodiments, the conductive vias of the patterned conductive layers in each redistribution structure (e.g., 190, 150, and 110) may be tapered toward a same direction (e.g., from the conductive joints 1022 toward the conductive terminals 210. The second die 170 of the semiconductor package 10A may have a higher thermal output during operation than the first die 130. The thermal-dissipating features 196 are disposed over and thermally coupled to the second die 170, and the thermal-dissipating features 196 may propagate heat generated from the second die 170 toward an ambient environment through the first and second thermal-dissipating vias 1961 and 1963, the first and second thermal-dissipating patterns 1962 and 1964, the second pre-solder layers 2332, and the thermal-dissipating bumps 234.

In some embodiments, the pattern density (e.g., a global pattern density) in the thermal-dissipating area R1 right above the second die 170 ranges from about 80% to 90% to ensure that the surface area of the thermal-dissipating features 196 is sufficiently large to cool the second die and prevent overheating. The global pattern density, as used herein, may be the total area of the thermal-dissipating features on a photomask divided by the total area of the photomask. In alternative embodiments, the thermal-dissipating bumps 234 are omitted, and the pattern density (e.g., the global pattern density) in the thermal-dissipating area R1 ranges from about 70% to 80% (or at least 65%).

Figure 3:
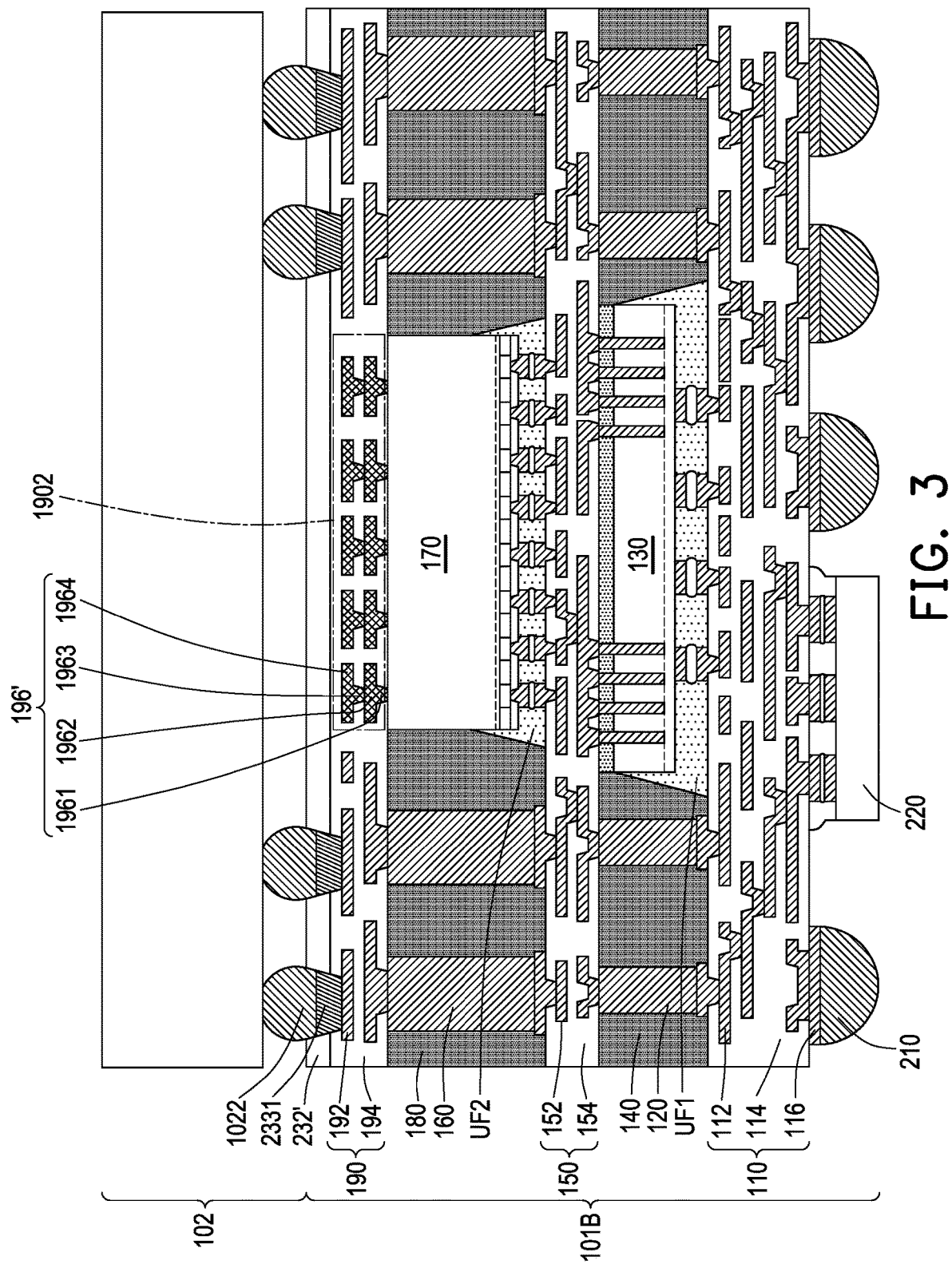
FIGS. 3-4, and 6A are schematic cross-sectional views illustrating various semiconductor packages, in accordance with some embodiments.

FIG. 3 is a schematic cross-sectional view illustrating a semiconductor package in accordance with some embodiments. Unless specified otherwise, the materials and the formation methods of the components in these embodiments are essentially the same as the like components, which are denoted by like reference numerals in the embodiments.

Referring to FIG. 3 and with reference to FIG. 1K, the semiconductor package 10B is similar to the semiconductor package 10A, except that the lower package component 101B of the semiconductor package 10B is free of the thermal-dissipating bumps 234, the second pre-solder layers 2332, and the second openings 2322 as included in the semiconductor package 10A. For example, the patterned dielectric layer 232' overlying the third dielectric layer 194 of the third redistribution structure 190 fully covers the thermal-dissipating region 1902. The thermal-dissipating features 196' including the first and second thermal-dissipating vias 1961 and 1963 and the first and second thermal-dissipating patterns 1962 and 1964 in the thermal-dissipating region 1902 may be underneath the patterned dielectric layer 232' and fully embedded in the third dielectric layer 194 of the third redistribution structure 190. In some embodiments, the pattern density (e.g., the global pattern density) in the thermal-dissipating region 1902 right above the second die 170 ranges from about 70% to 80% (or at least 65%).

Figure 4:
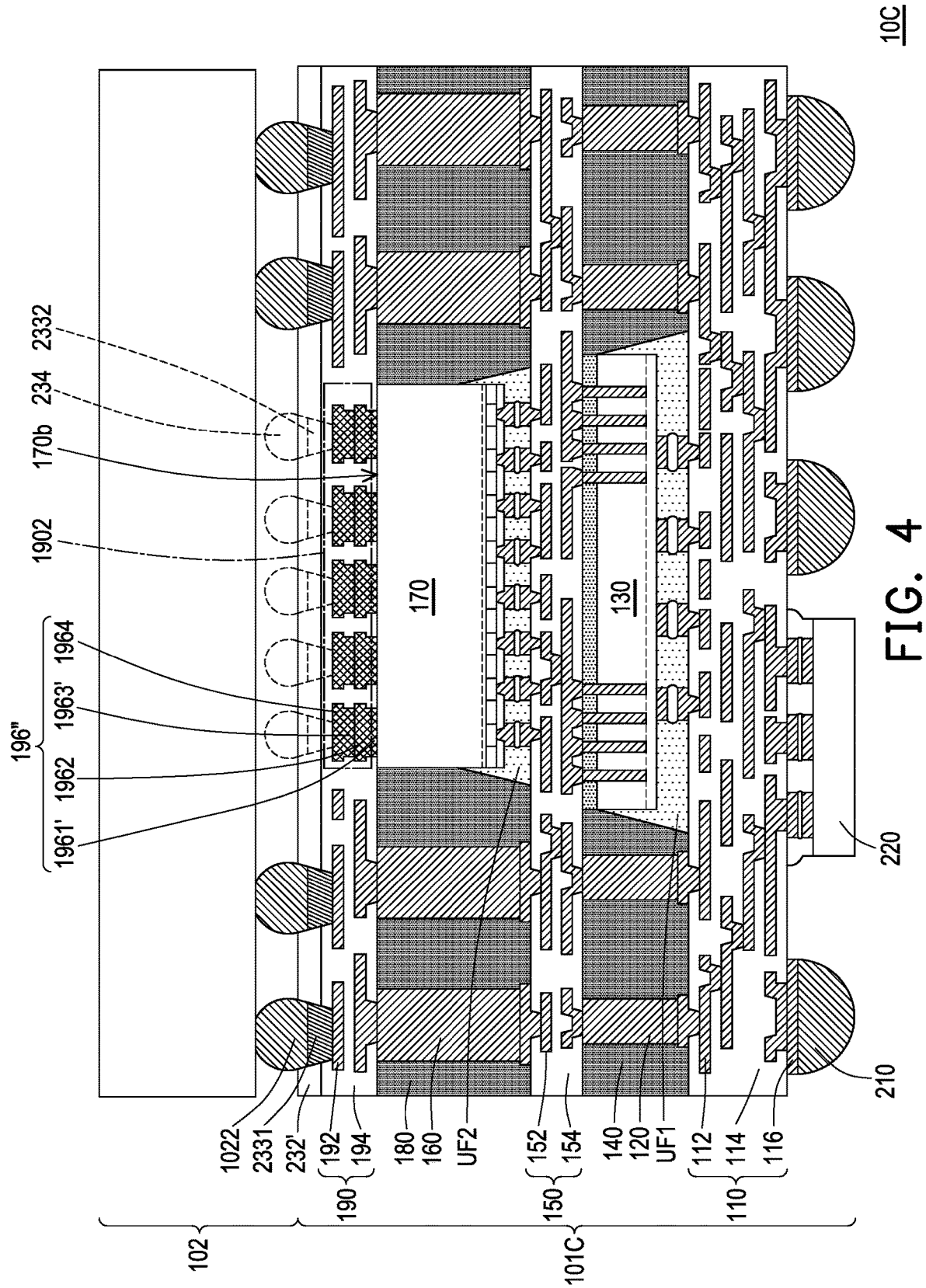
Figure 5A:
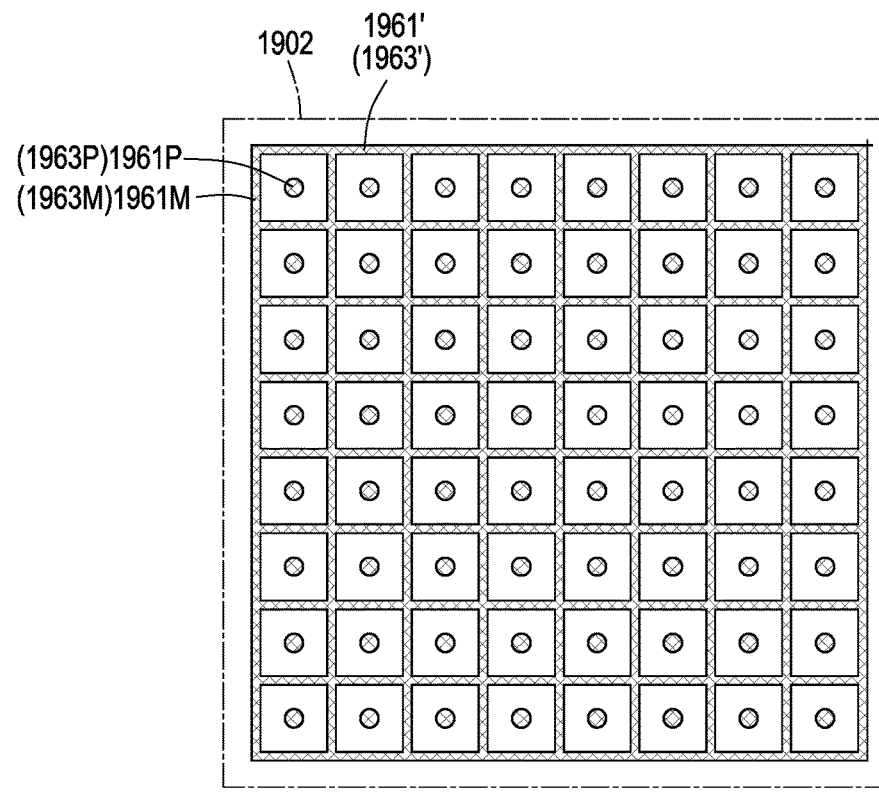
FIG. 5A is a schematic top view illustrating a configuration of a thermal-dissipating pattern, in accordance with some embodiments.
Figure 5B:
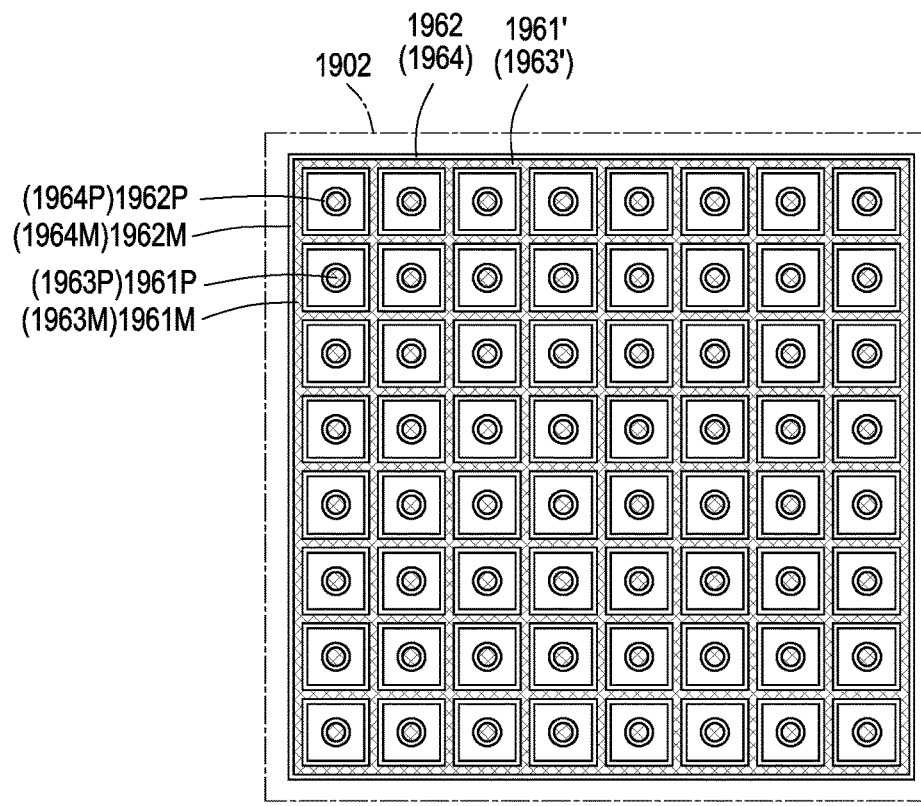
FIG. 5B is a schematic top view illustrating a combined configuration of multi-leveled thermal-dissipating patterns, in accordance with some embodiments.

FIG. 4 is a schematic cross-sectional view illustrating a semiconductor package FIG. 5A is a schematic top view illustrating a configuration of a thermal-dissipating pattern, and FIG. 5B is a schematic top view illustrating a combined configuration of multi-leveled thermal-dissipating patterns, in accordance with some embodiments. Unless specified otherwise, the materials and the formation methods of the components in these embodiments are essentially the same as the like components, which are denoted by like reference numerals in the embodiments.

Referring to FIG. 4 and with reference to FIG. 3, the semiconductor package 10C is similar to the semiconductor package 10B, except for the thermal-dissipating features 196" in the lower package component 101C of the semiconductor package 10C. In some embodiments, the thermal-dissipating features 196" in thermal-dissipating region 1902 includes multilevel thermal-dissipating patterns (1961', 1962, 1963', and 1964) stacked upon one another. In some embodiments, the pattern density (e.g., the global pattern density) in the thermal-dissipating region 1902 right above the second die 170 ranges from about 70% to 80% (or at least 65%). In other embodiments, the thermal-dissipating bumps 234 and/or the second pre-solder layers 2332 may be disposed on the topmost thermal-dissipating pattern 1964 for better heat dissipation, and thus the thermal-dissipating bumps 234 and the second pre-solder layers 2332 are illustrated in dash lines to indicate they may (or may not) exist.

With continued reference to FIGS. 4-5A and also referring to FIGS. 1G and 2B, the even-layered thermal-dissipating patterns (1962 and 1964) may be similar to the thermal-dissipating patterns (1962 and 1964) described in FIGS. 1G and 2B. The odd-layered thermal-dissipating patterns (1961' and 1963') may each have a mesh and pads formed in openings of the mesh. For example, the bottommost thermal-dissipating pattern 1961' includes a mesh 1961M and pads 1961P disposed within openings of the mesh with a one-to-one correspondence from the top view of FIG. 5A, and bottom surfaces of the mesh 1961M and the pads 1961P may be in physical contact with the back surface 170b of the second die 170 from the cross-sectional view of FIG. 4. Similarly, the thermal-dissipating pattern 1963' includes a mesh 1963M and pads 1963P disposed within openings of the mesh with a one-to-one correspondence, as shown in FIG. 5A.

Referring to FIG. 5B and with reference to FIGS. 2C, as seen from the top view, the fourth thermal-dissipating pattern 1964 overlies the third thermal-dissipating pattern 1963', and the second thermal-dissipating pattern 1962 overlies the first thermal-dissipating pattern 1961'. The configuration of the thermal-dissipating patterns 1962 and 1961' may be similar to the thermal-dissipating patterns 1964 and 1963'. Taking thermal-dissipating patterns 1962 and 1961' for example, the overlying thermal-dissipating pattern 1962 may fully (or partially) cover the underlying thermal-dissipating pattern 1961' from the top view. For example, the mesh 1962M has longer length and width than the length and width of the underlying mesh 1961M, and the pads 1962P has greater diameter than the diameter of the underlying pads 1961.

Figure 6A:
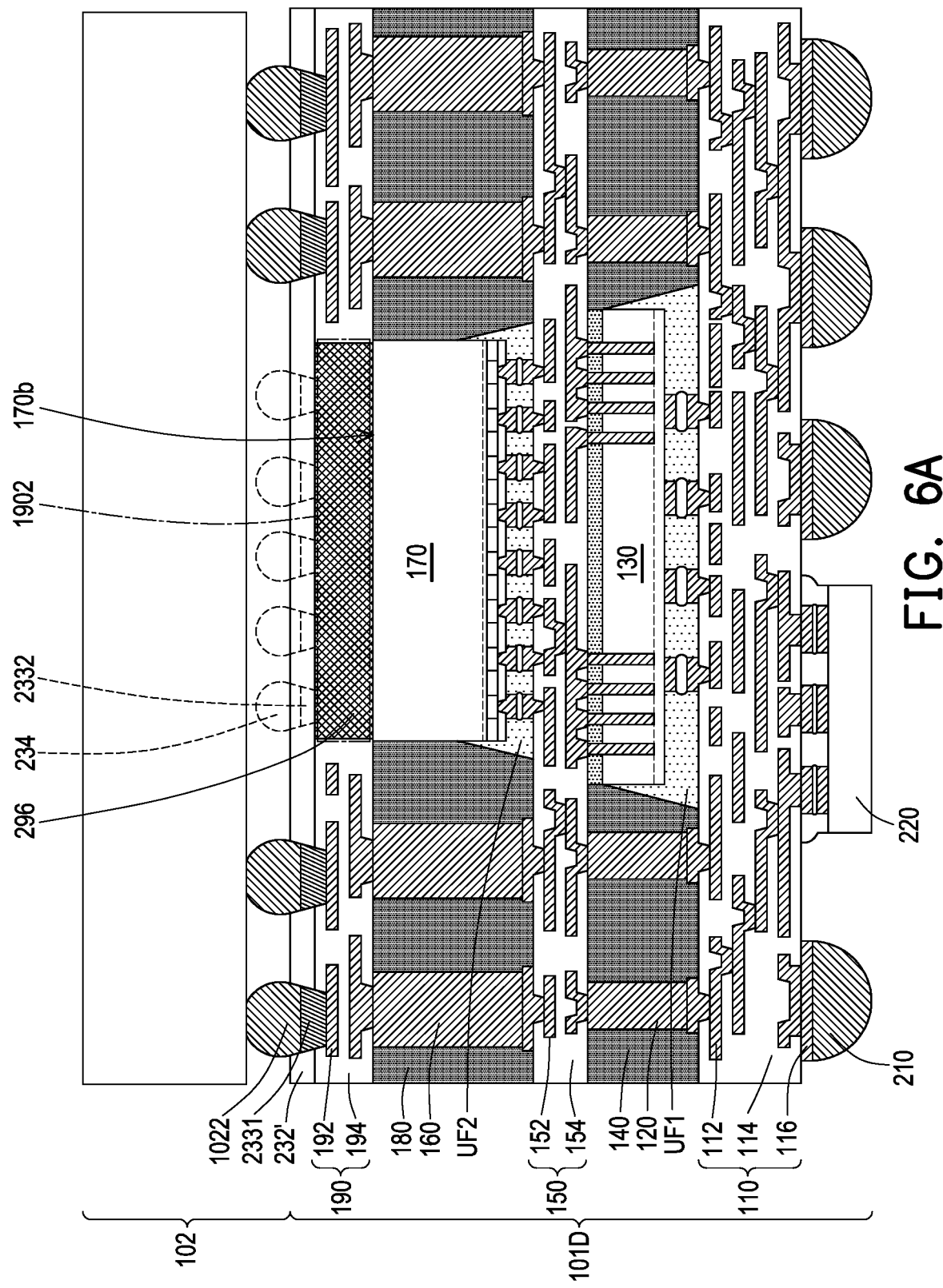
Figure 6B:
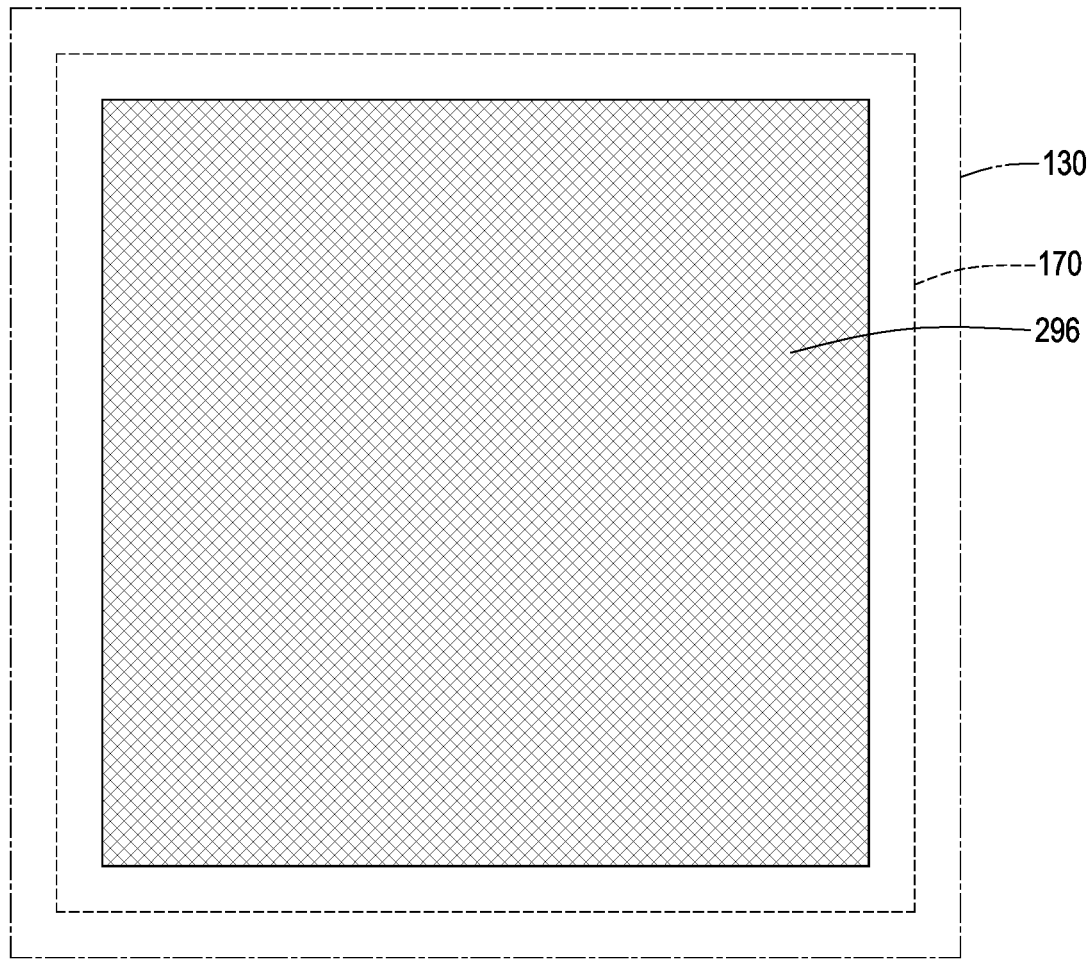
FIG. 6B is a schematic top view illustrating a configuration of the thermal-dissipating feature, the first die, and the second die of the semiconductor package of FIG. 6A, in accordance with some embodiments.

FIG. 6A is a schematic cross-sectional view illustrating a semiconductor package 10D, and FIG. 6B is a schematic top view illustrating a configuration of the thermal-dissipating feature, the first die, and the second die of the semiconductor package 10D, in accordance with some embodiments. Unless specified otherwise, the materials and the formation methods of the components in these embodiments are essentially the same as the like components, which are denoted by like reference numerals in the embodiments.

Referring to FIG. 6A and with reference to FIG. 3, the semiconductor package 10D is similar to the semiconductor package 10B, except that the thermal-dissipating feature 196' is replaced with the thermal-dissipating feature 296. The thermal-dissipating feature 296 is a thermally conductive path through which heat that is generated from the second die 170 is dissipated to the ambient. In some embodiments, the term "thermally conductive" refers to the property of a material to conduct and transfer heat (e.g., allow the heat to flow) from one area to another. For example, the thermal-dissipating feature 296 in the lower package component 101D is laterally covered by the third dielectric layer 194 of the third redistribution structure 190, the patterned dielectric layer 232' overlies the top surface of the thermal-dissipating feature 296, and the bottom surface of the thermal-dissipating feature 296 is in physical and thermal contact with the back surface 170b of the second die 170. The thermal-dissipating feature 296 may be a single thermally conductive layer or a multi-layered thermally conductive structure. In the illustrated embodiments, the pattern density (e.g., the global pattern density) in the thermal-dissipating region 1902 right above the second die 170 is about 100%.

The material of the thermal-dissipating feature 296 may be a metal, such as copper, copper alloy, aluminum, gold, or other suitable metals or metal alloys. In some embodiments, the thermal-dissipating feature 296 includes thermally conductive filler materials that include a filler material from at least one or more of metallic material, semiconductor material, solder material, carbon nano tubes, carbon nano fibers, graphite, etc. The sidewall of the thermal-dissipating feature 296 may be (or may not be) aligned with the sidewall of the second die 170. In some embodiments, the lateral dimension of the thermal-dissipating feature 296 is less than that of the second die 170. In alternative embodiments, the thermal-dissipating feature 296 includes a plurality of strips (or blocks) discontinuously distributed on the back surface 170b of the second die 170. In other embodiments, the thermal-dissipating bumps 234 and/or the second pre-solder layers 2332 may be disposed on the block of the thermal-dissipating feature 296 for better heat dissipation, and thus the thermal-dissipating bumps 234 and the second pre-solder layers 2332 are illustrated in dash lines to indicate they may (or may not) exist.

With continued reference to FIG. 6A and also referring to FIG. 6B, in the top view, an orthographic projection area of the thermal-dissipating feature 296 may be less than an orthographic projection area of the second die 170, and the orthographic projection area of the second die 170 may be less than an orthographic projection area of the first die 130. In some embodiments, the boundary line of the thermal-dissipating feature 296 is fully encircled by the boundary line of the second die 170, from the top view. The boundary line of the second die 170 may be fully (or partially) encircled by the boundary line of the first die 130. In alternative embodiments, one or more thermal-dissipating feature 296 may be disposed in the location of the thermal-dissipating region 1902 corresponding to a hot spot of the second die 170 for efficient heat dissipation. The top-view shape of the thermal-dissipating feature 296 may be rectangular or square. Alternatively, the thermal-dissipating feature 296 may have other top-view shape (e.g., circular shape, oval shape, polygonal shape, irregular shape, etc.). It should be noted that the number, the shape, and the configuration of the thermal-dissipating feature 296 illustrated herein are merely examples and may be varied depending on thermal dissipation requirements of various semiconductor packages.

FIGS. 7A-7I are schematic cross-sectional views illustrating various stages of a manufacturing method of a semiconductor package, in accordance with some embodiments. Unless specified otherwise, the materials and the formation methods of the components in these embodiments are essentially the same as the like components, which are denoted by like reference numerals in the embodiments.

Figure 7A:
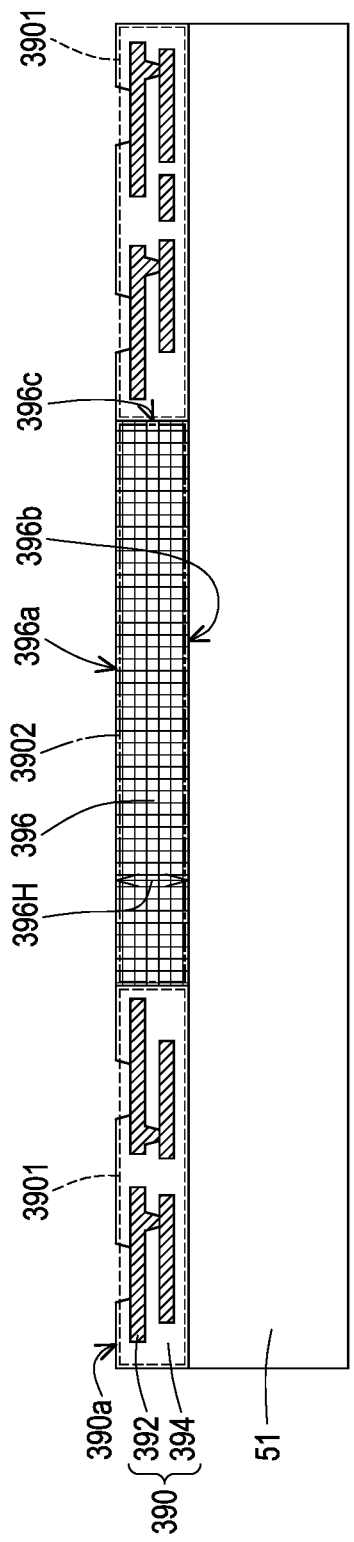
FIGS. 7A-7I are schematic cross-sectional views illustrating various stages of a manufacturing method of a semiconductor package, in accordance with some embodiments.

Referring to FIG. 7A, a first redistribution structure 390 including one or more first patterned conductive layer 392 embedded in one or more first dielectric layer 394 may be formed over the temporary carrier 51. The first patterned conductive layer 392 may be located within the circuit region 3901. The first patterned conductive layer 392, the first dielectric layer 394, and the temporary carrier 51 may be similar to the first patterned conductive layer 112, the first dielectric layer 114, and the temporary carrier 51 described in FIG. 1A, and thus the detailed descriptions are not repeated for the sake of brevity. The first redistribution structure 390 includes a first surface 390a and a second surface 390b opposite to the first surface 390a and facing the temporary carrier 51. In some embodiments, the second surface 390b is the bottommost surface of the first dielectric layer 394, and a plurality of openings may be formed in the first surface 390a to accessibly reveal the topmost sublayer of the first patterned conductive layer 392 for further electrical connection.

In some embodiments, a thermal-dissipating feature 396 is disposed on the temporary carrier 51 within the thermal-dissipating region 3902 and laterally covered by the first dielectric layer 394 of the first redistribution structure 110. The thermal-dissipating feature 396 may include a first surface 396a, a second surface 396b opposite to the first surface 396a and facing the temporary carrier 51, and a sidewall 396c connected to the first and second surfaces 396a and 396b and covered by the first dielectric layer 394. By way of example and not limitation, the thickness 396H of the thermal-dissipating feature 396 may be about 40 μm. In some embodiments, the first surface 396a of the thermal-dissipating feature 396 is substantially leveled (or coplanar) with the first surface 390a of the first redistribution structure 390, within process variations.

The thermal-dissipating feature 396 may be placed on the temporary carrier 51 prior to the formation of the first redistribution structure 390. In some embodiments, the first redistribution structure 390 is formed over the temporary carrier 51, and then a portion of the first dielectric layer 114 is removed to form a hole, the thermal-dissipating feature 396 is then disposed in the hole. The thermal-dissipating feature 396 may be a dummy die (e.g., a dummy silicon). Alternatively, the material of the thermal-dissipating feature 396 may include a metal or metal alloys. The thermal-dissipating feature 396 may be a single thermally conductive layer or a multi-layered thermally conductive structure. The thermal-dissipating feature 396 may include thermally conductive filler materials for better heat dissipation.

Figure 7B:
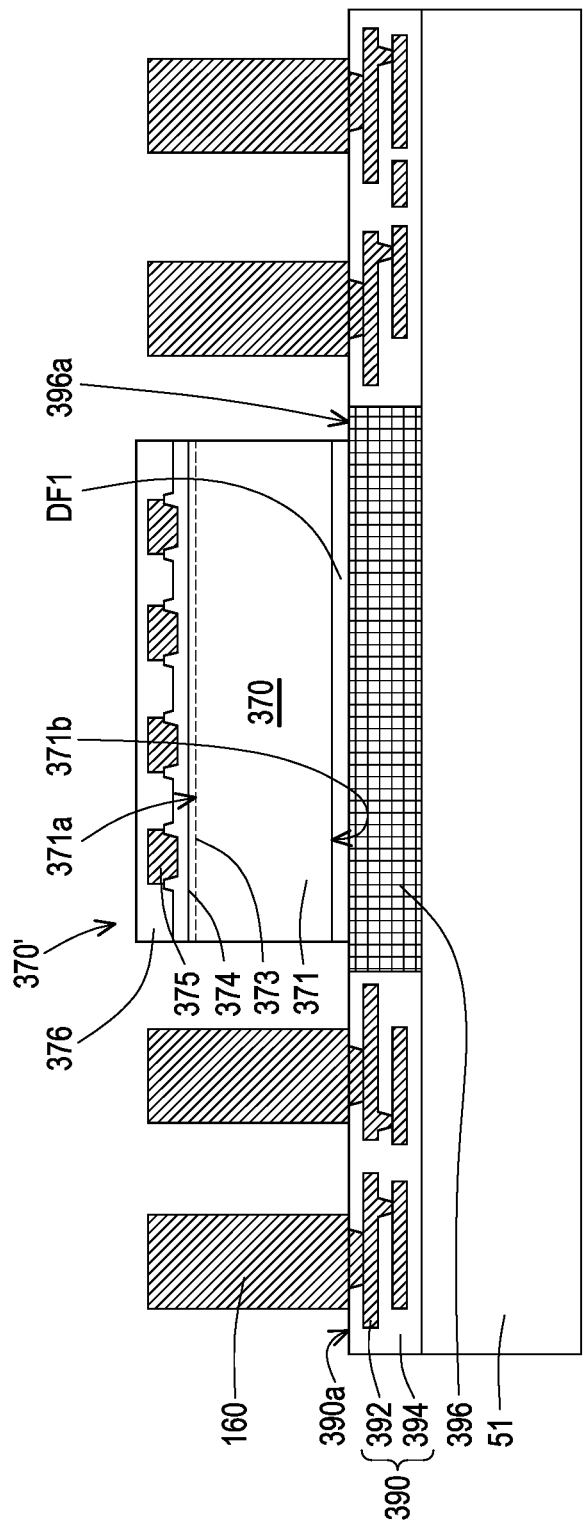

Referring to FIG. 7B, the conductive pillars 160 may be formed on the first surface 390a of the first redistribution structure 390 with via portions formed in the openings in the first surface 390a and connecting the pillar portions and the underlying topmost sublayer of the first patterned conductive layer 392. A die 370' may be attached to the first surface

396a of the thermal-dissipating feature 396 through, for example, a connecting film DF1 or any suitable adhesive. In some embodiments, the connecting DF1 may be or may include a die attach film (DAF) or a thermal interface material(s). Alternatively, the connecting film DF1 may be omitted. The die 370' may be cut from a semiconductor wafer (not shown) and disposed on the thermal-dissipating feature 396 through a pick-and-place process. The die 370' may be similar to the second die 170, and the like components are denoted by like reference numerals.

In some embodiments, the die 370' includes a semiconductor substrate 371 having a front surface 371a and back surface 371b on which the connecting film DF1 is disposed, a device layer 373 having semiconductor devices formed in/on the front surface 371a of the semiconductor substrate 371, an interconnect structure 374 formed on and electrically coupled to the device layer 373, die connectors 375 formed on the interconnect structure 374 and electrically coupled to the semiconductor devices in the device layer 373 through the interconnect structure 374, and a protection layer 276 formed on the interconnect structure 374 and covering the die connectors 375. At this stage, the die connectors 375 may be buried in the protection layer 276.

Figure 7C:
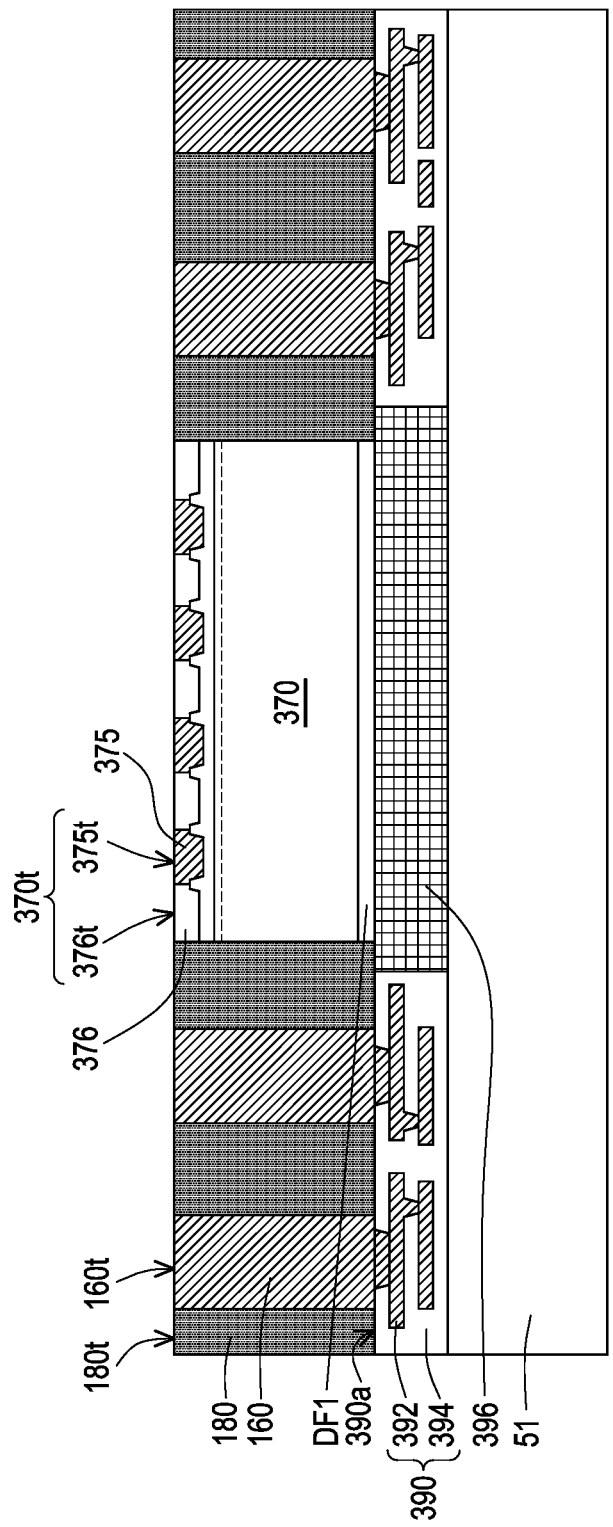

Referring to FIG. 7C and with reference to FIG. 7B, the insulating encapsulation 180 may be formed on the first redistribution structure 390 to cover the conductive pillars 160, the connecting film DF1, and the die 370. The material and the formation of the insulating encapsulation 180 may be similar to the second insulating encapsulation 180 described in FIG. 1F, and thus the detailed descriptions are not repeated for the sake of brevity. In some embodiments, a planarization process is performed to level the insulating encapsulation 180, the conductive pillars 160, and the die 370'. During the planarization process, a portion of the protection layer 376 may be removed until the die connectors 375 are accessibly revealed. In some embodiments, the top surface 180t of the insulating encapsulation 180 is substantially leveled (or coplanar) with the top surfaces 160t of the conductive pillars 160 and the top surface 370t of the die 370, within process variations, where the top surface 370t of the die 370 includes the top surface 376t of the protection layer 376 and the top surfaces 375t of the die connectors 375. In some embodiments, the conductive pillars 160 that penetrate through the insulating encapsulation 180 may be referred to as the TIVs 160.

Figure 7D:
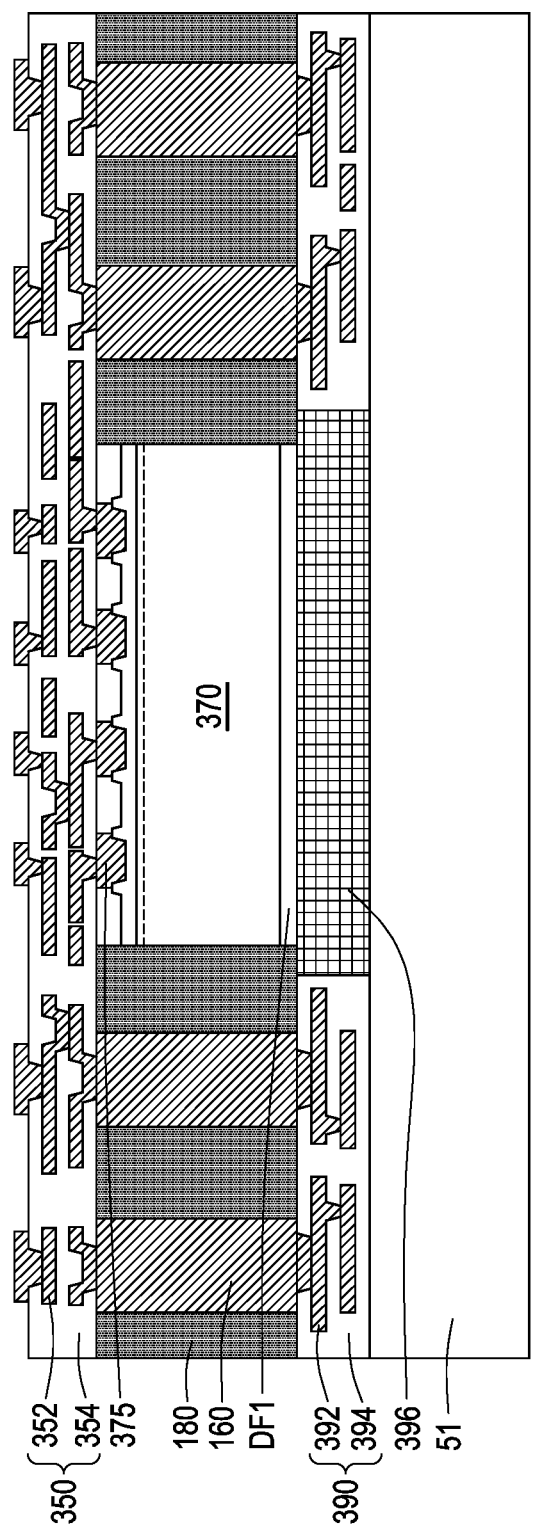

Referring to FIG. 7D, a second redistribution structure 350 including one or more second patterned conductive layer 352 embedded in one or more second dielectric layer 354 formed on the top surfaces of the insulating encapsulation 180, the TIVs 160, and the die 370. The materials of the second patterned conductive layer 352 and the second dielectric layer 354 are similar to the second patterned conductive layer 152 and the second dielectric layer 154. For example, the bottommost sublayer of the second patterned conductive layer 352 is in physical and electrical contact with the TIVs 160 and the die connectors 375 of the die 370. In some embodiments, the topmost sublayer of the second patterned conductive layer 352 includes UBM pads formed on the topmost sublayer of the second dielectric layer 354 for further electrical connection.

Figure 7E:
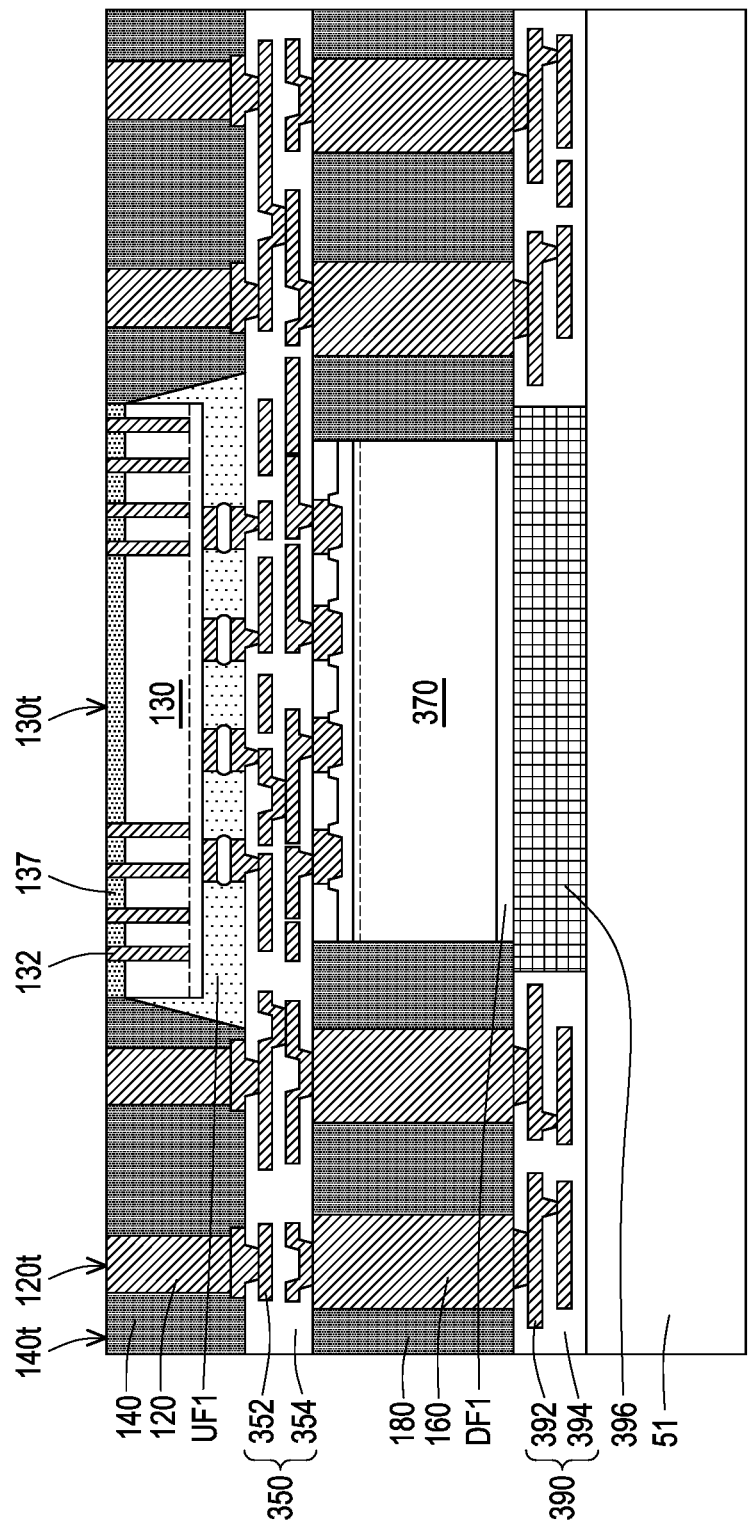

Referring to FIG. 7E, conductive pillars 120 may be formed on a portion of the UBM pads of the second patterned conductive layer 352, the die 130 may be coupled to another portion of the UBM pads of the second patterned conductive layer 352, and the first underfill layer UF1 may be formed in the gap between the die 130 and the second redistribution structure 350. The insulating encapsulation 140 may then be formed on the second redistribution structure 350 to cover the conductive pillars 120, the die 130, and the first underfill layer UF1. The conductive pillars 120 that penetrate through the insulating encapsulation 140 may be referred to as the TIVs 120. The forming processes of the insulating encapsulation 140, the die 130, and the conductive pillars 120 may be similar to the processes described in FIGS. 1B-1C, and thus the detailed descriptions are not repeated for the sake of brevity. In some embodiments, the top surface 140t of the insulating encapsulation 140 is substantially leveled (or coplanar) with the top surfaces 120t of the conductive pillars 120 and the top surface 130t of the die 130, within process variations, wherein the top surface 130t of the die 130 includes the top surfaces of the isolation layer 137 and the TSVs 132.

Figure 7F:
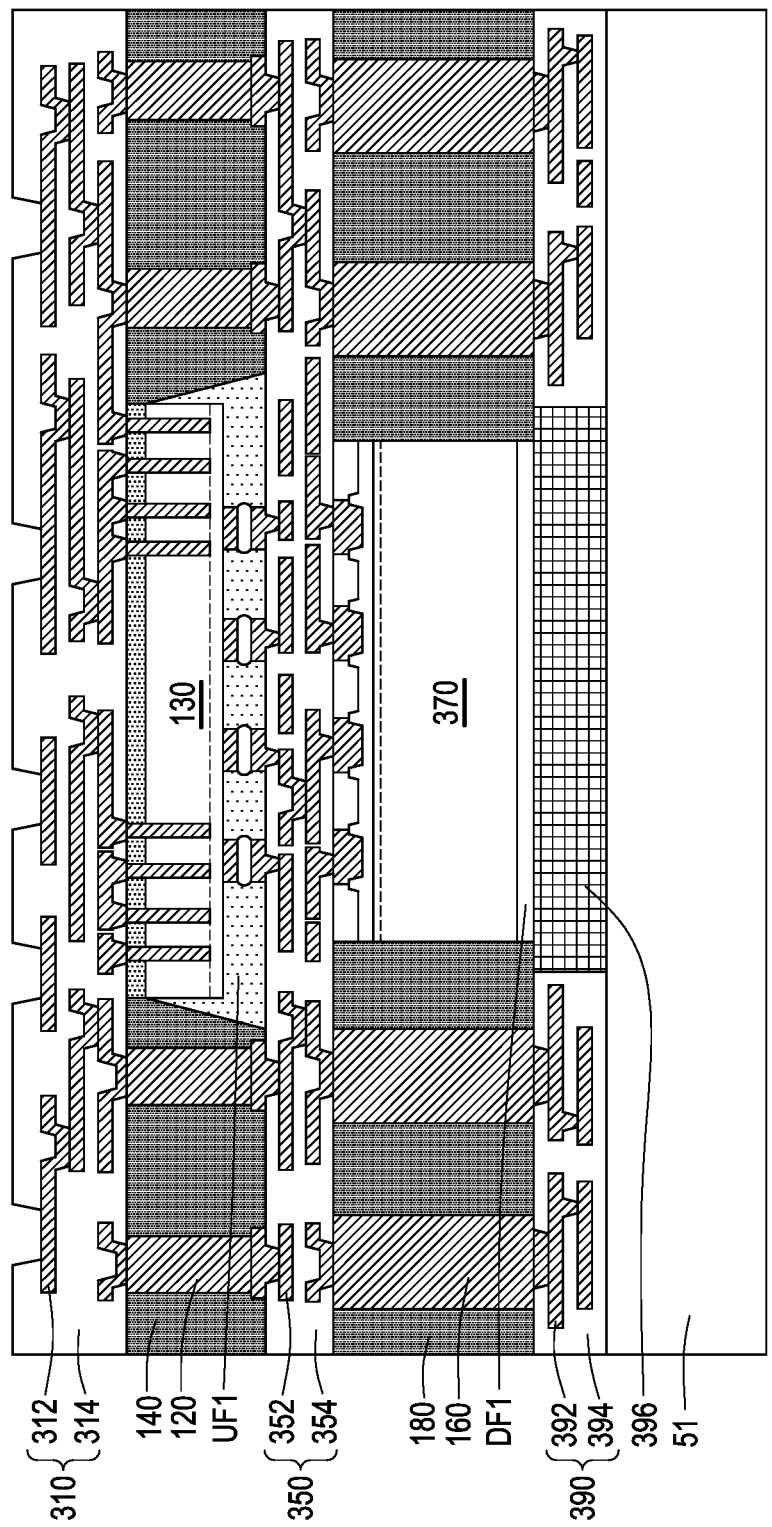

Referring to FIG. 7F, a third redistribution structure 310 including one or more third patterned conductive layer 312 embedded in one or more third dielectric layer 314 formed on the top surfaces of the insulating encapsulation 140, the TIVs 120, and the die 130. The materials of the third patterned conductive layer 312 and the third dielectric layer 314 are similar to the patterned conductive layer 112 and the dielectric layer 114. For example, the bottommost sublayer of the third patterned conductive layer 312 is in physical and electrical contact with the TIVs 120 and the TSVs 132 of the die 130. In some embodiments, pad portions of the topmost sublayer of the third patterned conductive layer 312 are accessibly revealed by the openings of the topmost sublayer of the third dielectric layer 314 for further electrical connection.

Figure 7G:
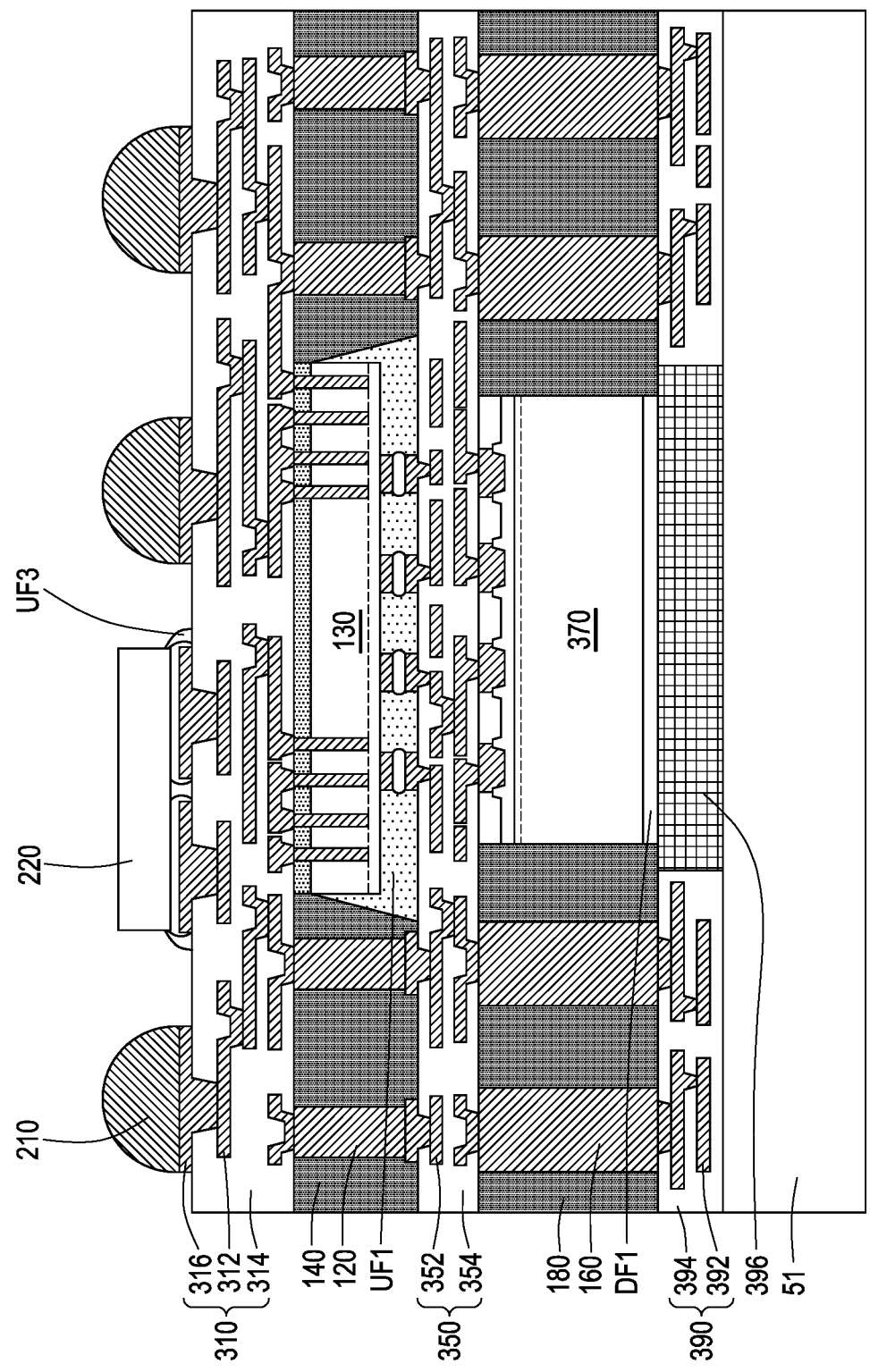

Referring to FIG. 7G, the third redistribution structure 310 may further include UBM pads 316 formed on the topmost sublayer of the third patterned conductive layer 312 for further electrical connection. For example, the conductive terminals 210 are formed over a portion of the UBM pads 316. In some embodiments, the electrical device 220 is mounted on another portion of the UBM pads 316. The underfill layer UF3 is optionally formed in a gap between the electrical device 220 and the third redistribution structure 310 to surround the connections therebetween. The formation of the conductive terminals 210 and the step of mounting the electrical device 220 may be similar to the processes described in FIG. 1I, and thus the detailed descriptions are not repeated for the sake of brevity.

Figure 7H:
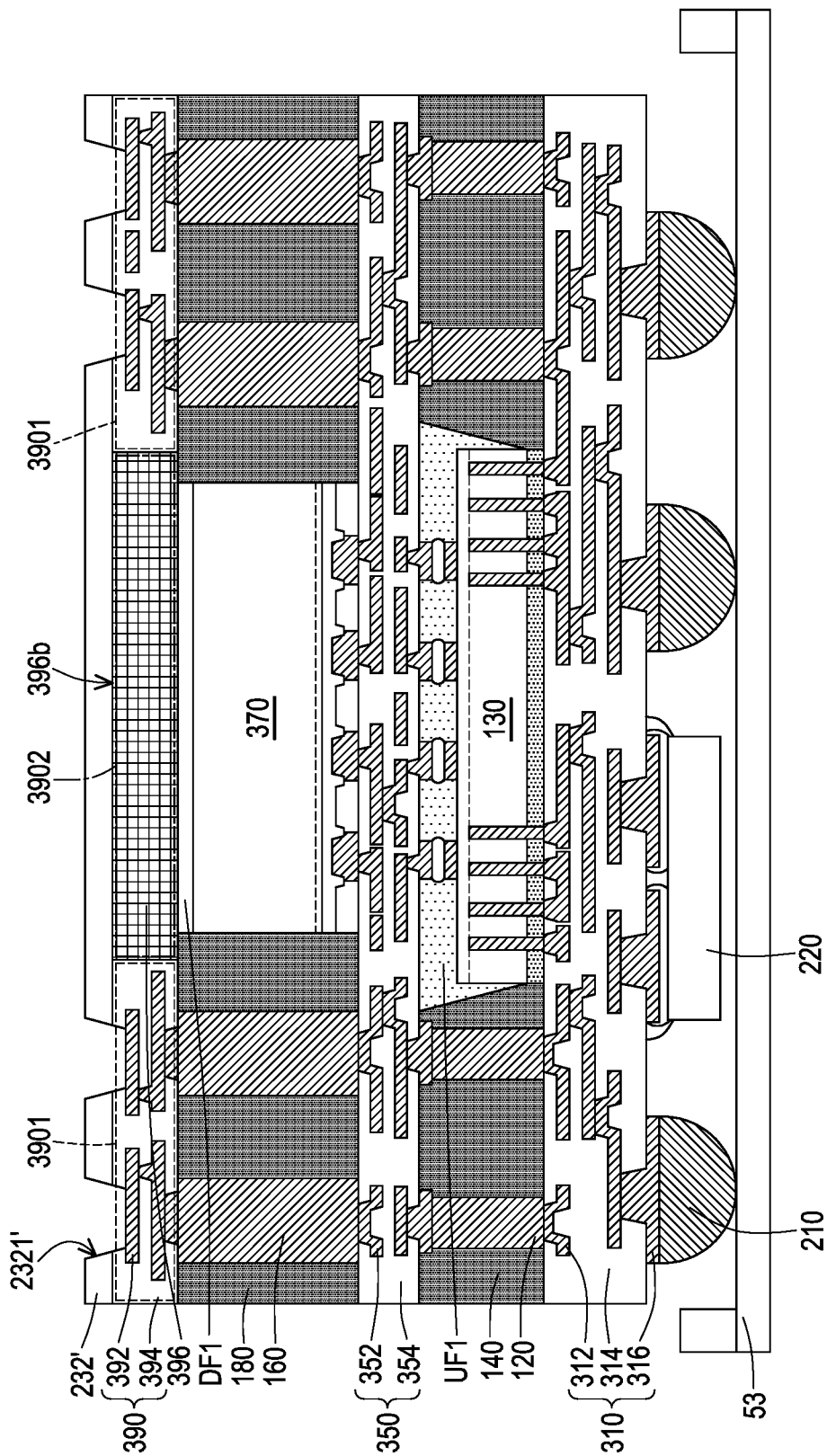

Referring to FIG. 7H and with reference to FIG. 7G, the structure of FIG. 7G may be flipped upside-down and placed on the frame 53. For example, the conductive terminals 210 and/or the electrical device 220 may be attached onto the frame 53, and the first redistribution structure 390 faces upwardly for further processing. Next, the temporary carrier 51 may be de-bonded to accessibly reveal the first redistribution structure 390. The de-bonding process of the temporary carrier 51 is similar to the process described in FIG. 1H. Subsequently, a patterned dielectric layer 232' with openings 2321' may be formed on the topmost sublayer of the first dielectric layer 394 and extends across the circuit region 3901 and the thermal-dissipating region 3902. The openings 2321' of the patterned dielectric layer 232' and the underlying openings of the first dielectric layer 394 to accessibly reveal at least a portion of the first patterned conductive layer 392 for further electrical connection. For example, the patterned dielectric layer 232' is in physical contact with the second surface 396b of the thermal-dissipating feature 396. In some other embodiments, the patterned dielectric layer 232' includes a window (not shown) accessibly exposing the second surface 396b of the thermal-dissipating feature 396 for better heat dissipation.

Figure 7I:
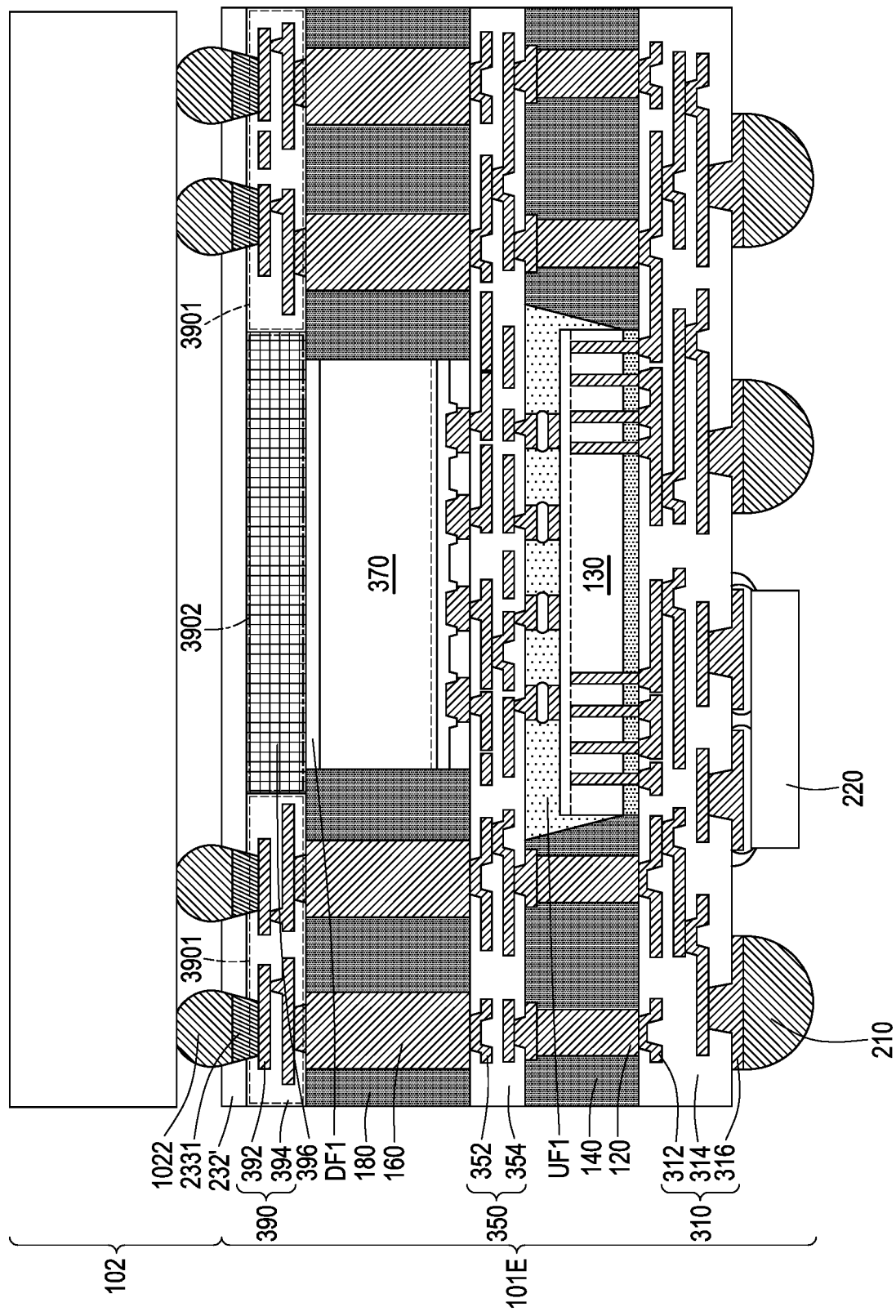

Referring to FIG. 7I, the first pre-solder layers 2331 may be formed on the exposed first patterned conductive layer 392 in the openings 2321' of the patterned dielectric layer 232'. The upper package component 102 may be disposed on and electrically coupled to the lower package component 101E to form a semiconductor package 10E. The external terminals of the upper package component 102 may be disposed on the first pre-solder layers 2331 and reflowed to form the conductive joints 1022 electrically and mechanically coupling the upper package component 102 to the underlying lower package component 101E. The formation of the first pre-solder layers 2331 and the step of mounting the upper package component 102 may be similar to the processes described in FIGS. 1J-1K. In some embodiments, an underfill layer (not shown) may be formed in a gap between the upper package component 102 and the patterned dielectric layer 232' to surround the conductive joints 1022. In some embodiments, the lower package component 101E is formed at wafer level, and a singulation process may be performed to form individual lower package components 101E after mounting the upper package component 102.

The semiconductor package 10E includes the dies 370 and 130 arranged in a face-to-face configuration since the active sides of the dies 370 and 130 are in proximity to each other. In some embodiments, the conductive vias of the patterned conductive layers in each redistribution structure (e.g., 390, 350, and 310) may be tapered toward a same direction (e.g., from the conductive terminals 210 toward the conductive joints 1022. The upper die 370 in the lower package component 101E may have a higher thermal output during operation than the lower die 130. The thermal-dissipating feature 396 thermally coupled to the upper die 370 may propagate heat generated from the upper die 370 toward an ambient environment. It should be noted that the thermal-dissipating feature 396 in the thermal-dissipating region 3902 may be replaced with any thermal-dissipating feature described somewhere else in the disclosure, depending on product requirements. The thermal-dissipating feature described herein may efficiently route the heat generated within the lower package component to designated areas outside the lower package component.

According to some embodiments, a semiconductor package includes a first die disposed on and electrically coupled to a first redistribution structure, a second die disposed over the first die and laterally covered by a second insulating encapsulation, a second redistribution structure interposed between and electrically coupled to the first and second dies, a third redistribution structure disposed on the second die and opposite to the second redistribution structure, and at least one thermal-dissipating feature. The first die is laterally covered by a first insulating encapsulation, and through substrate vias of the first die are physically connected to the second redistribution structure or the first redistribution structure. The third redistribution structure includes a patterned conductive layer embedded in a dielectric layer, the thermal-dissipating feature is embedded in the dielectric layer of the third redistribution structure and electrically isolated from the patterned conductive layer through the dielectric layer of the third redistribution structure, and the thermal-dissipating feature is thermally coupled to a back surface of the second die.

According to some alternative embodiments, a semiconductor package includes a lower package component and an upper package component stacked over the lower package component. The lower package component includes a lower die and an upper die stacked over and electrically coupled to the lower die, an upper redistribution structure overlying and electrically coupled to the upper die, and at least one thermal-dissipating feature. The upper die has a higher thermal output during operation than the lower die, the upper redistribution structure includes a patterned conductive layer embedded in a dielectric layer, the thermal-dissipating feature is embedded in the dielectric layer and isolated from the patterned conductive layer of the upper redistribution structure, and the thermal-dissipating feature is in thermal contact with a back surface of the upper die. The upper package component is coupled to the upper redistribution structure through conductive joints.

According to some alternative embodiments, a manufacturing method of a semiconductor package includes: forming a first insulating encapsulation on a first redistribution structure to cover a first die that is coupled to the first redistribution structure; forming a second redistribution structure on the first insulating encapsulation and the first die; coupling a second die to the second redistribution structure; forming a second insulating encapsulation on the second redistribution structure to cover the second die; forming a third redistribution structure on the second insulating encapsulation and the second die; and forming at least one thermal-dissipating feature during forming the third redistribution structure, where the at least one thermal-dissipating feature is embedded in a dielectric layer of the third redistribution structure and electrically isolated from a patterned conductive layer of the third redistribution structure, and the at least one thermal-dissipating feature is thermally coupled to a back surface of the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first die disposed on and electrically coupled to a first redistribution structure, and the first die laterally covered by a first insulating encapsulation;
    a second die disposed over the first die and laterally covered by a second insulating encapsulation;
    a second redistribution structure interposed between and electrically coupled to the first and second dies, and through substrate vias of the first die being physically connected to the second redistribution structure or the first redistribution structure;
    a third redistribution structure disposed on the second die and opposite to the second redistribution structure, the third redistribution structure comprising a patterned conductive layer embedded in a dielectric layer, the patterned conductive layer comprising a conductive via disposed in a first level of the dielectric layer and a conductive pad disposed over the conductive via and disposed in a second level of the dielectric layer; and
    at least one thermal-dissipating feature embedded in the dielectric layer of the third redistribution structure and electrically isolated from the patterned conductive layer through the dielectric layer of the third redistribution structure, and the at least one thermal-dissipating feature thermally coupled to a back surface of the second die, wherein the at least one thermal-dissipating feature comprises a thermal-dissipating via disposed in the first level of the dielectric layer and a thermal-dissipating pattern disposed over the thermal-dissipating via and disposed in the second level of the dielectric layer.

2. The semiconductor package of claim 1, wherein the thermal-dissipating via of the at least one thermal-dissipating feature comprises a bottom end connected to the back surface of the second die, a top end wider than the bottom end, and a tilt sidewall connected to the top end and the bottom end.

3. The semiconductor package of claim 1, wherein the at least one thermal-dissipating feature further comprises:
a pre-solder layer overlying the thermal-dissipating pattern, the pre-solder layer comprising a bottom portion laterally covered by the second level of the dielectric layer of the third redistribution structure and a top portion laterally covered by a patterned resist layer which overlies the second level of the dielectric layer of the third redistribution structure.

4. The semiconductor package of claim 3, wherein the at least one thermal-dissipating feature further comprises:
thermal-dissipating bumps disposed on the pre-solder layer and protruded from the patterned resist layer, wherein the thermal-dissipating bumps are electrically floating.

5. The semiconductor package of claim 4, wherein the pre-solder layer and the thermal-dissipating bumps are of different materials.

6. The semiconductor package of claim 4, further comprising:
a memory package component stacked over and electrically coupled to the third redistribution structure through conductive joints, wherein the conductive joints surround the thermal-dissipating bumps, and the thermal-dissipating bumps interposed between the memory package component and the third redistribution structure are spatially separated from the memory package component.

7. The semiconductor package of claim 1, wherein the at least one thermal-dissipating feature further comprises an additional thermal-dissipating via disposed right over the thermal-dissipating via.

8. The semiconductor package of claim 1, wherein the thermal-dissipating pattern of the at least one thermal-dissipating feature comprises:
a first thermal-dissipating pattern comprising a first mesh and first pads disposed within first openings of the first mesh; and
a second thermal-dissipating pattern comprising a second mesh and second pads disposed within second openings of the second mesh, the second mesh overlying the first mesh and having a greater dimension than the first mesh, and the second pads overlying the first pads and having a greater dimension than the first pads.

9. The semiconductor package of claim 1, wherein the first redistribution structure comprises a conductive via, and a sidewall of the conductive via of the first redistribution structure and a sidewall of the conductive via of the third redistribution structure are tilt toward a first direction.

10. The semiconductor package of claim 1, wherein in a top view, the at least one thermal-dissipating feature is located within a boundary of the second die, and the boundary of the second die is located within a boundary of the first die.

11. The semiconductor package of claim 1, wherein the second redistribution structure comprises a conductive via, and a sidewall of the conductive via of the second redistribution structure and a sidewall of the conductive via of the third redistribution structure are tilt toward a first direction.

12. A semiconductor package, comprising:
a lower package component comprising:
a lower die and an upper die stacked over and electrically coupled to the lower die, and the upper die having a higher thermal output during operation than the lower die;
an upper redistribution structure overlying and electrically coupled to the upper die, the upper redistribution structure comprising a patterned conductive layer embedded in a dielectric layer; and
at least one thermal-dissipating feature embedded in the dielectric layer and isolated from the patterned conductive layer of the upper redistribution structure, the at least one thermal-dissipating feature being in thermal contact with a back surface of the upper die, the at least one thermal-dissipating feature comprising a pre-solder layer embedded in the dielectric layer and thermal-dissipating bumps disposed on the pre-solder layer and protruded from the dielectric layer; and
an upper package component stacked over the lower package component and coupled to the upper redistribution structure through conductive joints, wherein the thermal-dissipating bumps are vertically spaced apart from a bottommost surface of the upper package component.

13. The semiconductor package of claim 12, wherein the at least one thermal-dissipating feature comprises:
a thermal-dissipating pattern physically connecting the pre-solder layer to the back surface of the upper die and embedded in the dielectric layer of the upper redistribution structure.

14. The semiconductor package of claim 13, wherein a thermal-dissipating via of the thermal-dissipating pattern is in physical contact with a semiconductor substrate of the upper die.

15. The semiconductor package of claim 12, wherein a lateral spacing between adjacent two of the conductive joints is greater than a lateral spacing between adjacent two of the thermal-dissipating bumps.

16. The semiconductor package of claim 12, wherein a diameter of the respective conductive joint is greater than a diameter of the respective thermal-dissipating bump.

17. A manufacturing method of a semiconductor package, comprising:
forming a first insulating encapsulation on a first redistribution structure to cover a first die that is coupled to the first redistribution structure;
forming a second redistribution structure on the first insulating encapsulation and the first die;
coupling a second die to the second redistribution structure;
forming a second insulating encapsulation on the second redistribution structure to cover the second die;
forming a third redistribution structure on the second insulating encapsulation and the second die, wherein forming the third redistribution structure comprises forming a patterned conductive layer in a dielectric layer, the patterned conductive layer comprises a conductive via disposed in a first level of the dielectric layer and a conductive pad disposed over the conductive via and disposed in a second level of the dielectric layer; and forming at least one thermal-dissipating feature during forming the third redistribution structure, wherein the at least one thermal-dissipating feature is embedded in the dielectric layer of the third redistribution structure and electrically isolated from a patterned conductive layer of the third redistribution structure, the at least one thermal-dissipating feature is thermally coupled to a back surface of the second die, and the at least one thermal-dissipating feature comprises a thermal-dissipating via disposed in the first level of the dielectric layer and a thermal-dissipating pattern disposed over the thermal-dissipating via and disposed in the second level of the dielectric layer.

18. The manufacturing method of claim 17, wherein forming the at least one thermal-dissipating feature comprises:

forming a pre-solder layer on the thermal-dissipating pattern.

19. The manufacturing method of claim 18, wherein forming the at least one thermal-dissipating feature further comprises:

forming thermal-dissipating bumps on the pre-solder layer, wherein the thermal-dissipating bumps are protruded from the third redistribution structure, and the pre-solder layer and the thermal-dissipating bumps are of different materials.

20. The manufacturing method of claim 17, wherein forming the thermal-dissipating pattern of the at least one thermal-dissipating feature comprises:

forming a mesh and a pad within an opening of the mesh, wherein the pad is directly over the thermal-dissipating via.

* * * * *